US012765035B2

(12) United States Patent
Kim et al.

(10) Patent No.: US 12,765,035 B2
(45) Date of Patent: Oct. 13, 2026

(54) SEMICONDUCTOR DEVICE AND METHOD OF FABRICATING THE SAME

(71) Applicant: Samsung Electronics Co., Ltd., Suwon-si (KR)

(72) Inventors: Sunghwan Kim, Hwaseong-si (KR); Geunwoo Kim, Seoul (KR); Wandon Kim, Seongnam-si (KR); Yoon Tae Hwang, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 804 days.

(21) Appl. No.: 17/821,033

(22) Filed: Aug. 19, 2022

(65) Prior Publication Data

US 2023/0135806 A1 May 4, 2023

(30) Foreign Application Priority Data

Oct. 28, 2021 (KR) ........................ 10-2021-0145716

(51) Int. Cl.
*H10D 64/62* (2025.01)
*H10D 30/01* (2025.01)
(Continued)

(52) U.S. Cl.
CPC ........... *H10D 64/62* (2025.01); *H10D 30/014* (2025.01); *H10D 30/031* (2025.01); *H10D 30/43* (2025.01);
(Continued)

(58) Field of Classification Search
CPC .... H10D 64/62; H10D 30/014; H10D 30/031; H10D 30/43; H10D 30/6729;
(Continued)

(56) References Cited

U.S. PATENT DOCUMENTS 6,139,699 A * 10/2000 Chiang ................. C23C 14/345 204/192.15
7,687,909 B2 * 3/2010 Ding ................. H01L 21/76876 257/751
(Continued)

FOREIGN PATENT DOCUMENTS

CN 1664686 A * 9/2005 ............... G08B 5/36
CN 101047229 A * 10/2007 ........... G11B 5/3903
(Continued)

OTHER PUBLICATIONS

Das, et al., "Strain induced FCC to BCC structural change in sputtered molybdenum thin films", Surface and Coatings Technology, 353, Nov. 2018, 292-299.

*Primary Examiner* — Mohammed Shamsuzzaman
(74) *Attorney, Agent, or Firm* — Wolf, Greenfield & Sacks, P.C.

(57) ABSTRACT

A semiconductor device includes a substrate including an active pattern, a channel pattern and a source/drain pattern that are on the active pattern and connected to each other, and an active contact electrically connected to the source/drain pattern. The active contact includes a first barrier metal and a first filler metal on the first barrier metal, and the first barrier metal includes a metal nitride layer. The first filler metal includes at least one of molybdenum, tungsten, ruthenium, cobalt, or vanadium. The first filler metal includes a first crystalline region having a body-centered cubic (BCC) structure and a second crystalline region having a face-centered cubic (FCC) structure. A proportion of the first crystalline region in the first filler metal ranges from 60% to 99%.

20 Claims, 45 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10P 14/20*** | (2026.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 64/01* (2025.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01); *H10P 14/3462* (2026.01)

(58) Field of Classification Search
CPC ........... H10D 30/6735; H10D 30/6757; H10D 62/121; H10D 64/01; H10D 64/017; H10D 84/0167; H10D 84/017; H10D 84/0186; H10D 84/038; H10D 84/85; H10D 30/62; H10D 30/0212; H10D 30/6219; H10D 62/822; H10D 64/256; H10D 30/797; H10D 62/151; H10D 62/832; H10D 84/0184; H10D 84/0188; H10D 62/83; H01L 21/02603; H01L 21/76805; H01L 23/5283; H01L 21/76843; H01L 21/76856; H01L 23/485; H01L 23/5226; H01L 23/53266; H01L 21/28568; H01L 21/76877; B82Y 10/00
See application file for complete search history.

(56) References Cited

U.S. PATENT DOCUMENTS

| | | | | |
|---|---|---|---|---|
| 7,968,952 | B2 * | 6/2011 | Fischer | H01L 21/76895 257/751 |
| 9,425,249 | B2 * | 8/2016 | Norman | H10H 20/822 |
| 9,755,140 | B2 * | 9/2017 | Lim | G11C 11/161 |
| 9,893,271 | B2 * | 2/2018 | Park | H10N 50/80 |
| 10,079,210 | B2 * | 9/2018 | Lee | H10D 84/834 |
| 10,346,087 | B2 | 7/2019 | Woo et al. | |
| 10,566,232 | B2 * | 2/2020 | Shen | H01L 21/76843 |
| 11,605,720 | B2 * | 3/2023 | Chen | H10D 64/667 |
| 12,300,729 | B2 * | 5/2025 | Wang | H01L 21/76889 |
| 2007/0241458 | A1 * | 10/2007 | Ding | C23C 14/0641 257/751 |
| 2011/0227224 | A1 | 9/2011 | Kitao | |
| 2015/0279840 | A1 * | 10/2015 | Huang | H01L 21/76897 438/283 |
| 2017/0103948 | A1 * | 4/2017 | Lee | H01L 21/76855 |
| 2018/0337090 | A1 * | 11/2018 | Shen | H01L 21/76813 |
| 2020/0006055 | A1 * | 1/2020 | Chen | H10D 64/017 |
| 2020/0388485 | A1 * | 12/2020 | Chen | H01L 21/76867 |
| 2022/0157955 | A1 * | 5/2022 | Park | H10D 64/258 |
| 2022/0220587 | A1 * | 7/2022 | Pun | C22C 1/0416 |
| 2022/0293600 | A1 * | 9/2022 | Kim | H10D 62/118 |
| 2022/0302274 | A1 * | 9/2022 | Kim | H10D 84/83 |
| 2022/0328496 | A1 * | 10/2022 | Kang | H10D 62/121 |
| 2022/0352326 | A1 * | 11/2022 | Huang | H10D 64/017 |
| 2024/0002995 | A1 * | 1/2024 | Anzelmo | B22F 1/12 |

FOREIGN PATENT DOCUMENTS

| | | | | | |
|---|---|---|---|---|---|
| CN | 109643742 | A | * | 4/2019 | H01L 21/7806 |
| CN | 110660726 | A | * | 1/2020 | H01L 23/522 |
| CN | 111130483 | A | * | 5/2020 | H03H 9/105 |
| CN | 111200422 | A | * | 5/2020 | H03K 3/35625 |
| CN | 114447214 | A | * | 5/2022 | H10N 50/85 |
| DE | 112018004229 | T5 | * | 7/2020 | G11C 11/161 |
| JP | 2003031806 | A | * | 1/2003 | H01L 21/823857 |
| JP | 2009510256 | A | * | 3/2009 | C21D 10/00 |
| JP | 2016046492 | A | * | 4/2016 | H10N 50/01 |
| JP | 6853663 | B2 | | 3/2021 | |
| KR | 1020000026197 | A | | 5/2000 | |
| KR | 100529646 | B1 | | 11/2005 | |
| KR | 20170045082 | A | * | 4/2017 | G11C 11/165 |
| KR | 1020180019418 | A | | 2/2018 | |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0145716, filed on Oct. 28, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit that may consist of metal-oxide-semiconductor field-effect transistors (MOS-FETs). To meet an increasing demand for a semiconductor device with a small pattern size and a reduced design rule, the MOS-FETs may be being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices.

SUMMARY

An embodiment of the inventive concept may provide a semiconductor device with improved electrical characteristics.

An embodiment of the inventive concept may provide a method of fabricating a semiconductor device with improved electrical characteristics.

According to an embodiment of the inventive concept, a semiconductor device may include a substrate including an active pattern, a channel pattern and a source/drain pattern that are on the active pattern and connected to each other, and an active contact electrically connected to the source/drain pattern. The active contact may include a first barrier metal and a first filler metal on the first barrier metal, and the first barrier metal may include a metal nitride layer. The first filler metal may include at least one of molybdenum, tungsten, ruthenium, cobalt, or vanadium. The first filler metal may include a first crystalline region having a body-centered cubic (BCC) structure and a second crystalline region having a face-centered cubic (FCC) structure. A proportion of the first crystalline region in the first filler metal may range from 60% to 99%.

According to an embodiment of the inventive concept, a semiconductor device may include a substrate including an active pattern, a channel pattern and a source/drain pattern that are on the active pattern and connected to each other, an active contact coupled to the source/drain pattern, and a metal layer on the active contact. An interconnection line in the metal layer may be electrically connected to the active contact through a via, and the active contact may include a first barrier metal and a first filler metal on the first barrier metal. The via may include a second barrier metal and a second filler metal on the second barrier metal, and each of the first and second barrier metals may include a metal nitride layer. The first and second filler metals may each include at least one of molybdenum, tungsten, ruthenium, cobalt, or vanadium. The first fillet metal includes a first crystalline region having a body-centered cubic (BCC) structure and the second filler metal includes a second crystalline region having the body-centered cubic (BCC) structure. A proportion of the body-centered cubic (BCC) structure in the first filler metal may be higher than a proportion of a body-centered cubic (BCC) structure in the second filler metal.

According to an embodiment of the inventive concept, a semiconductor device may include a substrate including a PMOSFET region and an NMOSFET region, a first active pattern on the PMOSFET region and a second active pattern on the NMOSFET region, a first channel pattern and a first source/drain pattern on the first active pattern, a second channel pattern and a second source/drain pattern on the second active pattern, a gate electrode on the first and second channel patterns, a gate insulating layer between the gate electrode and the first and second channel patterns, a gate spacer on a side surface of the gate electrode, a gate capping pattern on a top surface of the gate electrode, a gate cutting pattern penetrating the gate electrode, an interlayer insulating layer on the gate capping pattern and the gate cutting pattern, an active contact that penetrates the interlayer insulating layer and is electrically connected to the first and second source/drain patterns, metal-semiconductor compound layers between the active contact and the first and second source/drain patterns, respectively, a gate contact that penetrates the interlayer insulating layer and the gate capping pattern and electrically connected to the gate electrode, a first metal layer on the interlayer insulating layer, the first metal layer including a power line, which overlaps the gate cutting pattern in a direction normal to a surface of the substrate, and first interconnection lines, which are electrically connected to the active and gate contacts, respectively, and a second metal layer on the first metal layer. The second metal layer may include second interconnection lines electrically connected to the first metal layer. The active contact may include a first barrier metal and a first filler metal on the first barrier metal, and the gate contact may include a second barrier metal and a second filler metal on the second barrier metal. A proportion of a body-centered cubic (BCC) structure in the first filler metal may be higher than a proportion of a body-centered cubic (BCC) structure in the second filler metal.

According to an embodiment of the inventive concept, a method of fabricating a semiconductor device may include forming an active pattern on a substrate, forming a sacrificial pattern, which extends in a first direction, on the active pattern, forming a source/drain pattern, which includes a sacrificial layer, at a side of the sacrificial pattern, forming an interlayer insulating layer on the sacrificial pattern and the source/drain pattern, replacing the sacrificial pattern with a gate electrode, forming a contact trench in the interlayer insulating layer, such that at least a portion of the source/drain pattern is free of the interlayer insulating layer, and forming an active contact in the contact trench. The forming of the active contact may include forming a barrier metal layer in the contact trench, performing a plasma-using ion bombardment process on the barrier metal layer, and forming a filler metal layer on the barrier metal layer. A proportion of a body-centered cubic (BCC) structure in the filler metal layer may range from 60% to 99%.

DETAILED DESCRIPTION

Figure 1:
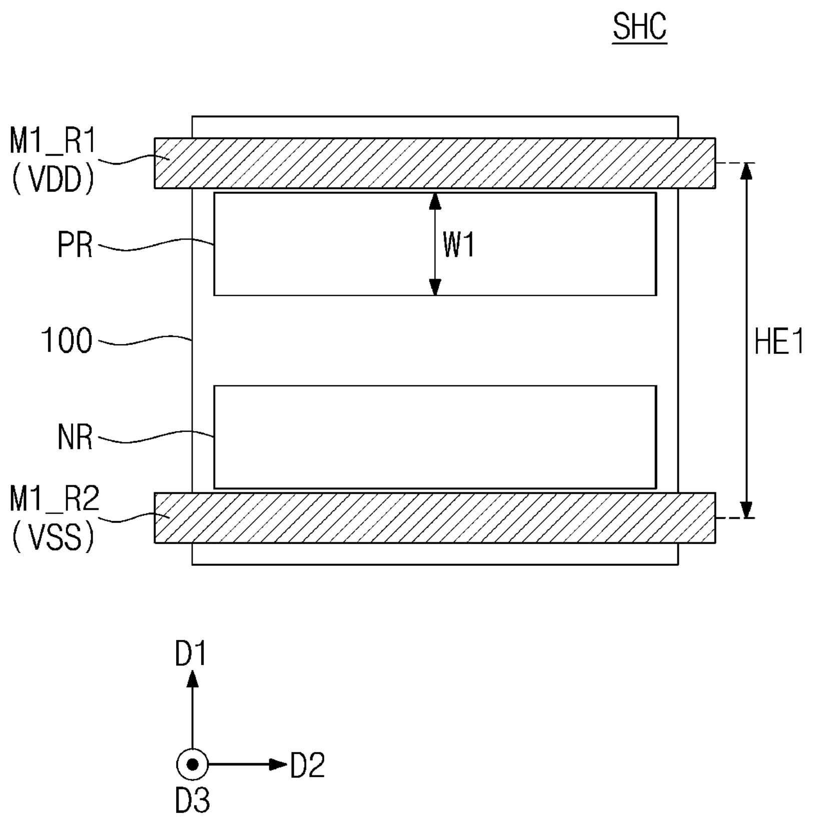
FIGS. 1 to 3 are conceptual diagrams illustrating logic cells of a semiconductor device according to an embodiment of the inventive concept.
Figure 2:
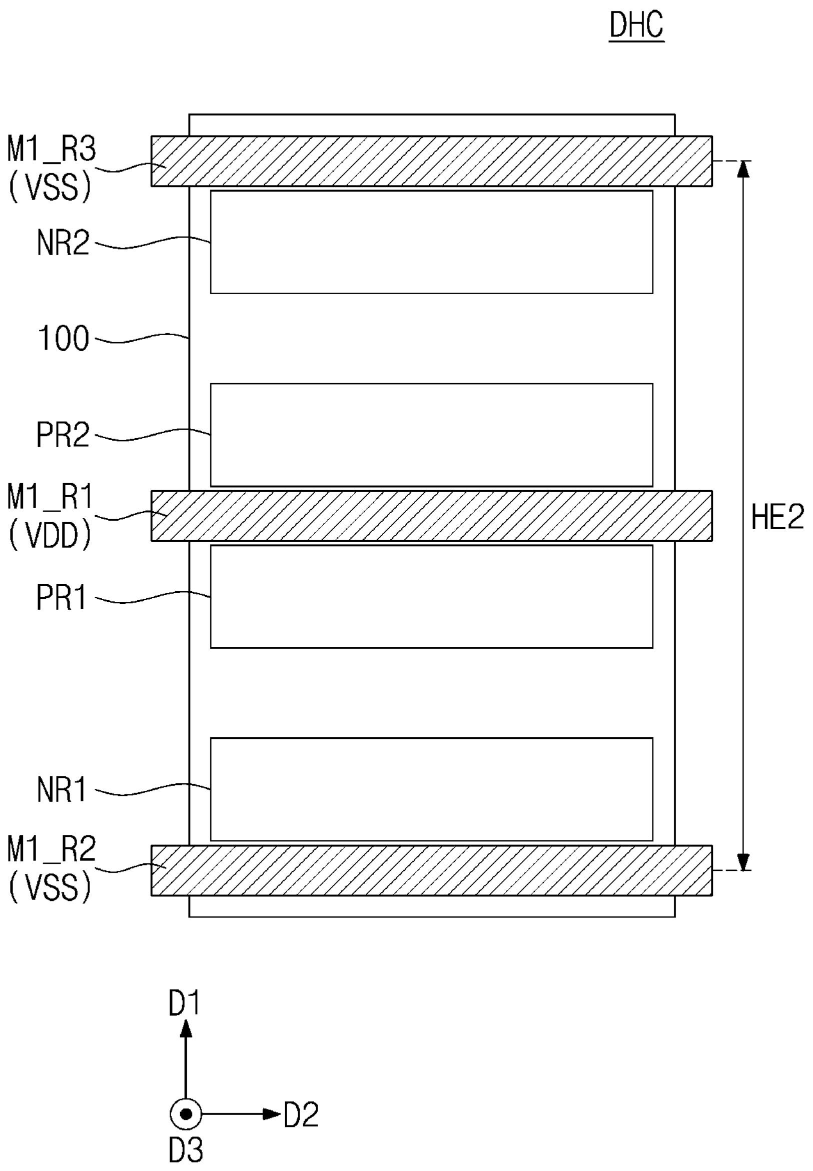
Figure 3:
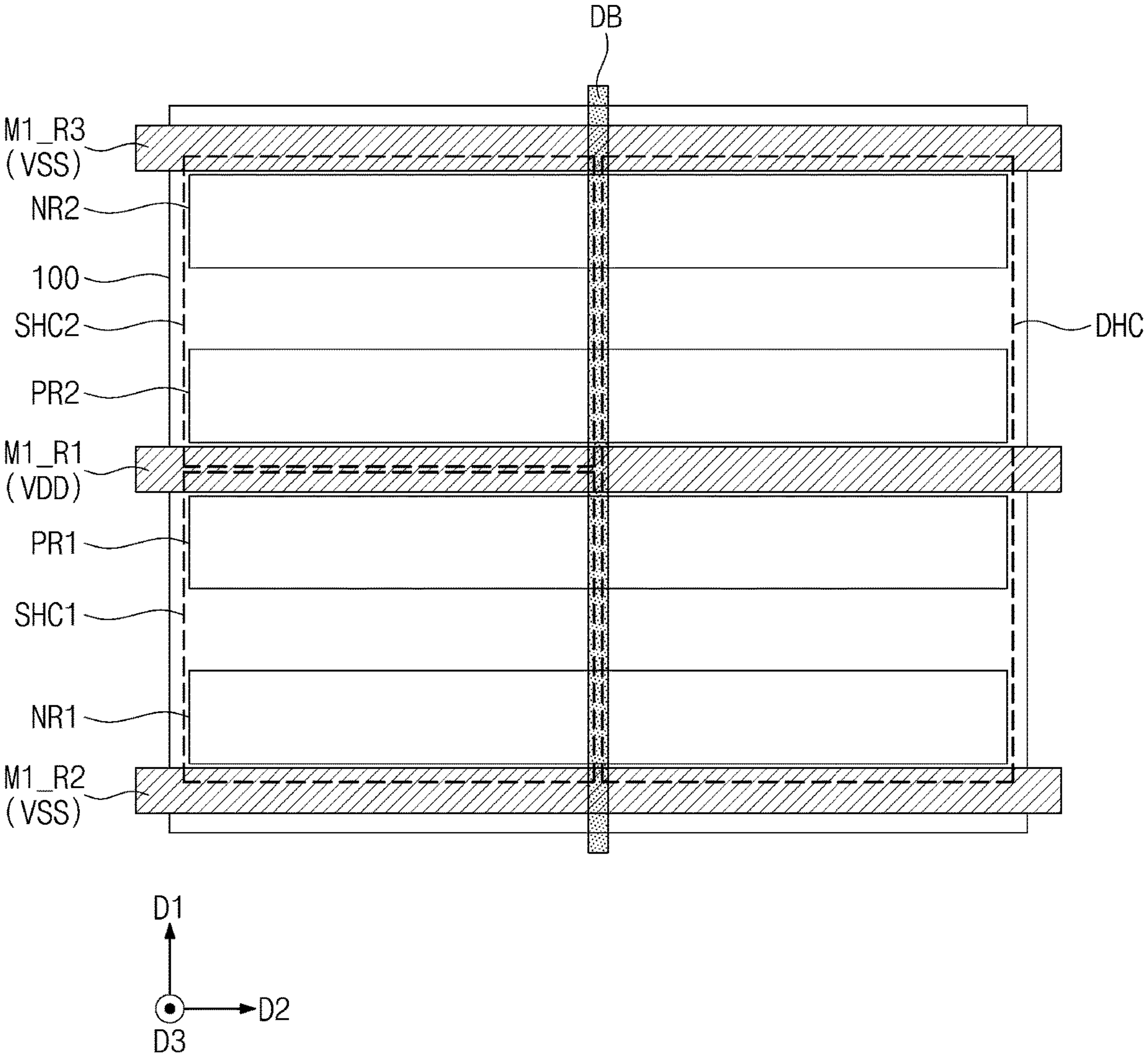

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. FIGS. 1 to 3 are conceptual diagrams illustrating logic cells of a semiconductor device according to an embodiment of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width WI1 in a first direction D1. In other embodiments, the widths of the PR and NR regions may be different I the first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to constitute as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
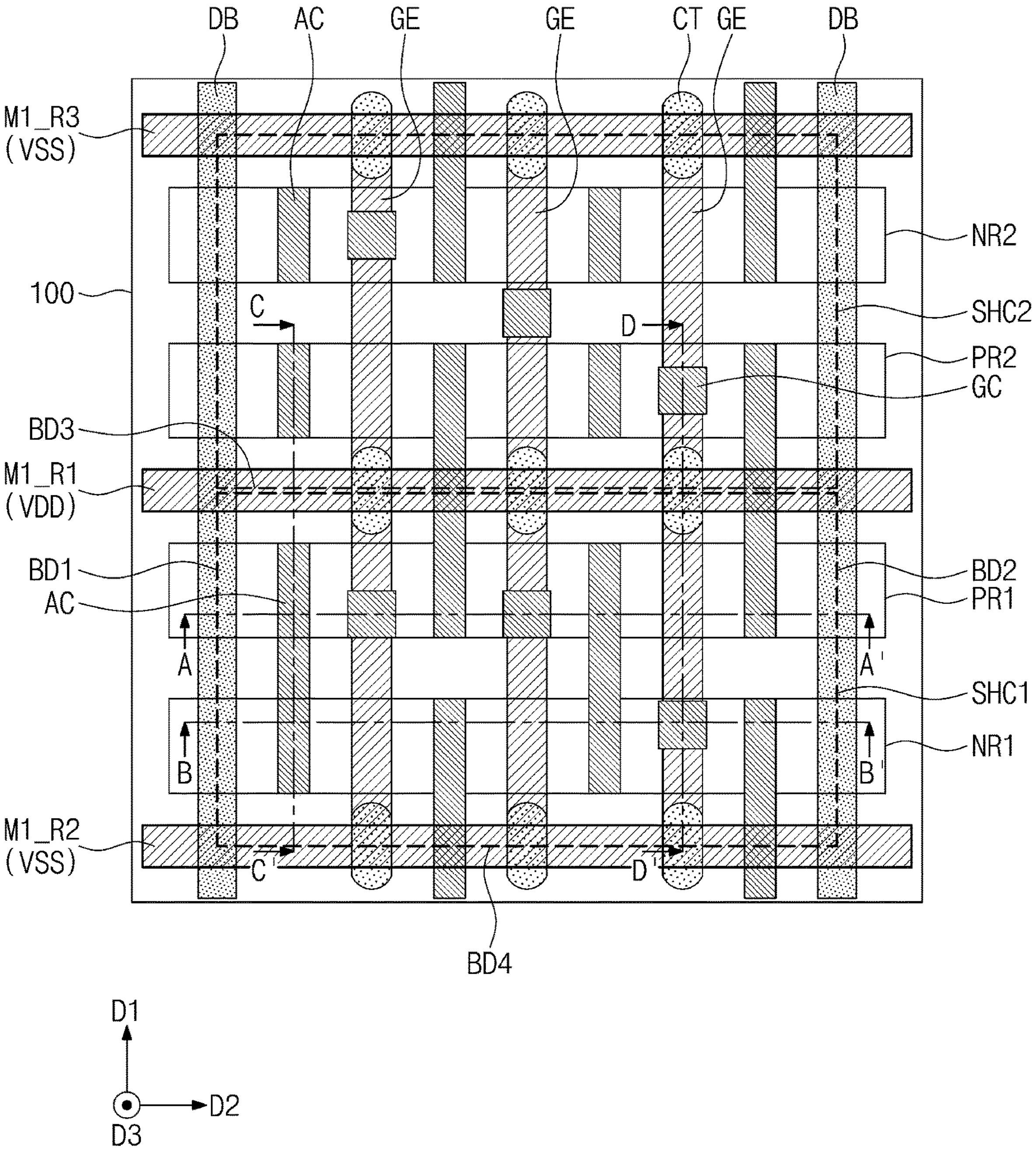
FIG. 4 is a plan view illustrating a semiconductor device according to an embodiment of the inventive concept.

FIG. 4 is a plan view illustrating a semiconductor device according to an embodiment of the inventive concept. FIGS. 5A to 5D are sectional views, which are respectively taken along lines A-A', B-B', C-C', and D-D' of FIG. 4. FIG. 6 is an enlarged sectional view illustrating a portion 'M' of FIG. 5A. FIGS. 4 and 5A to 5D illustrate an example of a detailed structure of the first and second single height cells SHC1 and SHC2 of FIG. 3.

Referring to FIGS. 4 and 5A to 5D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes one or more materials, such as silicon, germanium, silicon germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may extend in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. Each of the first and second active patterns AP1 and AP2 may be a vertically-protruding portion of the substrate 100, i.e., extending in the D3 direction or a direction normal to an upper surface of the substrate 100.

A device isolation layer ST may be provided to at least partially fill the trench TR. The device isolation layer ST may include a silicon oxide layer. The device isolation layer ST may not cover first and second channel patterns CH1 and CH2, i.e., at least a portion of the first and second channel patterns CH1 and CH2 may be free of the device isolation layer ST as will be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3 or a direction normal to an upper surface of the substrate 100).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3 in the D3 direction and in a cross-sectional view with the substrate 100 serving as a base reference layer. In another embodiment, a top surface of at least one of the first and second source/drain patterns SD1 and SD2 may be located at substantially the same level as the top surface of the third semiconductor pattern SP3 in the D3 direction.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Hereinafter, a sectional shape of the first source/drain pattern SD1 in the second direction D2 will be described in more detail with reference to FIG. 5A.

The buffer layer BFL may be on and at least partially cover an inner surface of the first recess RS1. In an embodiment, the buffer layer BFL may have a decreasing thickness in an upward direction, i.e., the D3 direction or a direction normal to an upper surface of the substrate 100. For example, a thickness of the buffer layer BFL, which is measured in the third direction D3 on a bottom of the first recess RS1, may be larger than a thickness of the buffer layer BFL, which is measured in the second direction D2 at a top level of the first recess RS1. In addition, the buffer layer BFL may have a 'U'-shaped section along a profile of the first recess RS1.

The main layer MAL may fill most of an unfilled region of the first recess RS1 having the buffer layer BFL therein. A volume of the main layer MAL may be larger than a volume of the buffer layer BFL. That is, a ratio of the volume of the main layer MAL to a total volume of the first source/drain pattern SD1 may be greater than a ratio of the volume of the buffer layer BFL to a total volume of the first source/drain pattern SD1.

Each of the buffer and main layers BFL and MAL may be formed of or include silicon germanium (SiGe). In some embodiments, the buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %. More specifically, the germanium concentration of the buffer layer BFL may range from 2 at % to 8 at %.

The main layer MAL may contain a relatively high concentration of germanium (Ge). As an example, a germanium concentration of the main layer MAL may range from 30 at % to 70 at %. The germanium concentration of the main layer MAL may increase in the third direction D3. For example, a portion of the main layer MAL, which is adjacent to the buffer layer BFL, may have a germanium concentration of about 40 at %, and an upper portion of the main layer MAL may have a germanium concentration of about 60 at %.

Each of the buffer and main layers BFL and MAL may contain an impurity (e.g., boron, gallium, or indium) that allows the first source/drain pattern SD1 to have a p-type conductivity. The impurity concentration of each of the buffer and main layers BFL and MAL may range from 1E18 atoms/$cm^3$ to 5E22 atoms/$cm^3$. An impurity concentration of the main layer MAL may be greater than an impurity concentration of the buffer layer BFL.

The buffer layer BFL may prevent or reduce the likelihood of a stacking fault between the substrate 100 (i.e., the first active pattern AP1) and the main layer MAL and between the first to third semiconductor patterns SP1, SP2, and SP3 and the main layer MAL. The stacking fault may lead to an increase of a channel resistance. The stacking fault may easily occur on the bottom of the first recess RS1. Thus, to prevent the stacking fault, the buffer layer BFL may be provided to have a relatively large thickness near the bottom of the first recess RS1.

The buffer layer BFL may protect the main layer MAL from a process of replacing sacrificial layers SAL, which will be described below, with the first to third portions PO1, PO2, and PO3 of the gate electrode GE. For example, the buffer layer BFL may prevent or inhibit an etchant material, which is used to remove the sacrificial layers SAL, from entering and etching the main layer MAL.

Referring back to FIGS. 4 and 5A to 5D, the gate electrodes GE may extend in the first direction D1 and may cross the first and second channel patterns CH1 and CH2. The gate electrodes GE may be arranged at a first pitch in the second direction D2. Each of the gate electrodes GE may overlap the first and second channel patterns CH1 and CH2 in the vertical or D3 direction.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Referring back to FIG. 5A, the first to third portions PO1, PO2, and PO3 of the gate electrode GE on the PMOSFET region PR may have different widths from each other in the D2 direction. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIGS. 4 and 5A to 5D, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may overlap the gate electrodes GE, respectively, in the D3 direction. The gate cutting patterns CT may be formed of or include one or more insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. That is, the gate electrode GE extending in the first direction D1 may be divided into a plurality of the gate electrodes GE by the gate cutting patterns CT.

A pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE in the D3 direction with the substrate 100 serving as a base reference layer. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In another embodiment, the gate spacers GS may be a multi-layered structure, which is formed of or includes at least two different materials selected from SiCN, SiCON, and SiN.

A gate capping pattern GP may be provided on the gate electrode GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may be on and at least partially cover the top surface TS, the bottom surface BS, and the opposite side surfaces SW of each of the first to third semiconductor patterns SP1, SP2, and SP3. The gate insulating layer GI may be on and at least partially cover a top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or include one or more high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have a ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but embodiments of the inventive concept are not limited to these examples.

The ferroelectric layer and the paraelectric layer may be formed of or include the same material. The ferroelectric layer may have a ferroelectric property, but the paraelectric layer may not have a ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit a ferroelectric property only when its thickness is in a specific range. In an embodiment, the ferroelectric layer may have a thickness ranging from 0.5 to 10 nm, but embodiments of the inventive concept are not limited to this example. Because a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. That is, the inner spacers IP may be provided on the second active pattern AP2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may be on and at least partially cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to be on and at least partially cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, pair of the division structures DB may be respectively provided on the first and second borders BD1 and BD2 of the first single height cell SHC1. The division structure DB may extend in the first direction D1 to be parallel to the gate electrodes GE. A pitch between the division structure DB and the gate electrode GE adjacent thereto may be equal to the first pitch.

The division structure DB may penetrate the first and second interlayer insulating layers 110 and 120 and may extend into the first and second active patterns AP1 and AP2. The division structure DB may penetrate an upper portion of each of the first and second active patterns AP1 and AP2. The division structure DB may electrically separate an active region of each of the first and second single height cells SHC1 and SHC2 from an active region of a neighboring cell.

Active contacts AC may penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that extends in the first direction D1.

The active contact AC may be a self-aligned contact. For example, the active contact AC may be formed by a self-alignment process using the gate capping pattern GP and the gate spacer GS. For example, the active contact AC may be on and cover at least a portion of the side surface of the gate spacer GS. Although not shown, the active contact AC may be on and at least partially cover a portion of the top surface of the gate capping pattern GP.

Metal-semiconductor compound layers SC (e.g., a silicide layer) may be respectively interposed between the active contact AC and the first source/drain pattern SD1 and between the active contact AC and the second source/drain pattern SD2. The active contact AC may be electrically connected to the source/drain pattern SD1 and SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Referring back to FIG. 5C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may extend from the second source/drain pattern SD2 of the first NMOSFET region NR1 to the first source/drain pattern SD1 of the first PMOSFET region PR1 in the first direction D1.

Gate contacts GC may penetrate the second interlayer insulating layer 120 and the gate capping pattern GP and may be electrically connected to the gate electrodes GE, respectively. When viewed in a plan view, two gate contacts GC on the first single height cell SHC1 may overlap the first PMOSFET region PR1 in the D3 direction. That is, the two gate contacts GC on the first single height cell SHC1 may be provided on the first active pattern AP1 (e.g., see FIG. 5A). When viewed in a plan view, a single gate contact GC on the first single height cell SHC1 may overlap the first NMOSFET region NR1 in the D3 direction. In other words, the single gate contact GC on the first single height cell SHC1 may be provided on the second active pattern AP2 (e.g., see FIG. 5B).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST at least partially filling the trench TR (e.g., see FIG. 4).

Figure 5A:
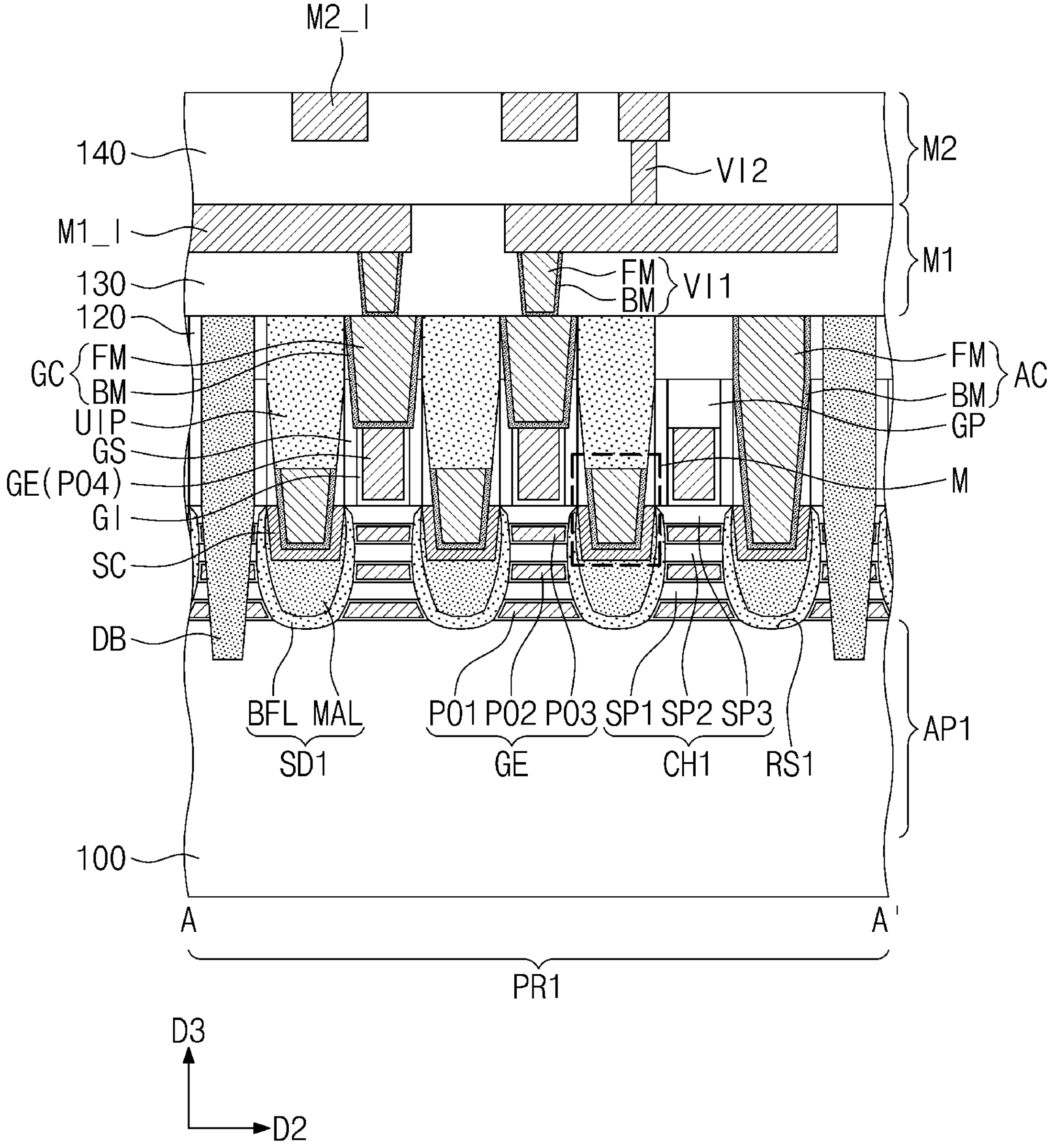
FIGS. 5A to 5D are sectional views, which are respectively taken along lines A-A', B-B', C-C', and D-D' of FIG. 4.
Figure 5B:
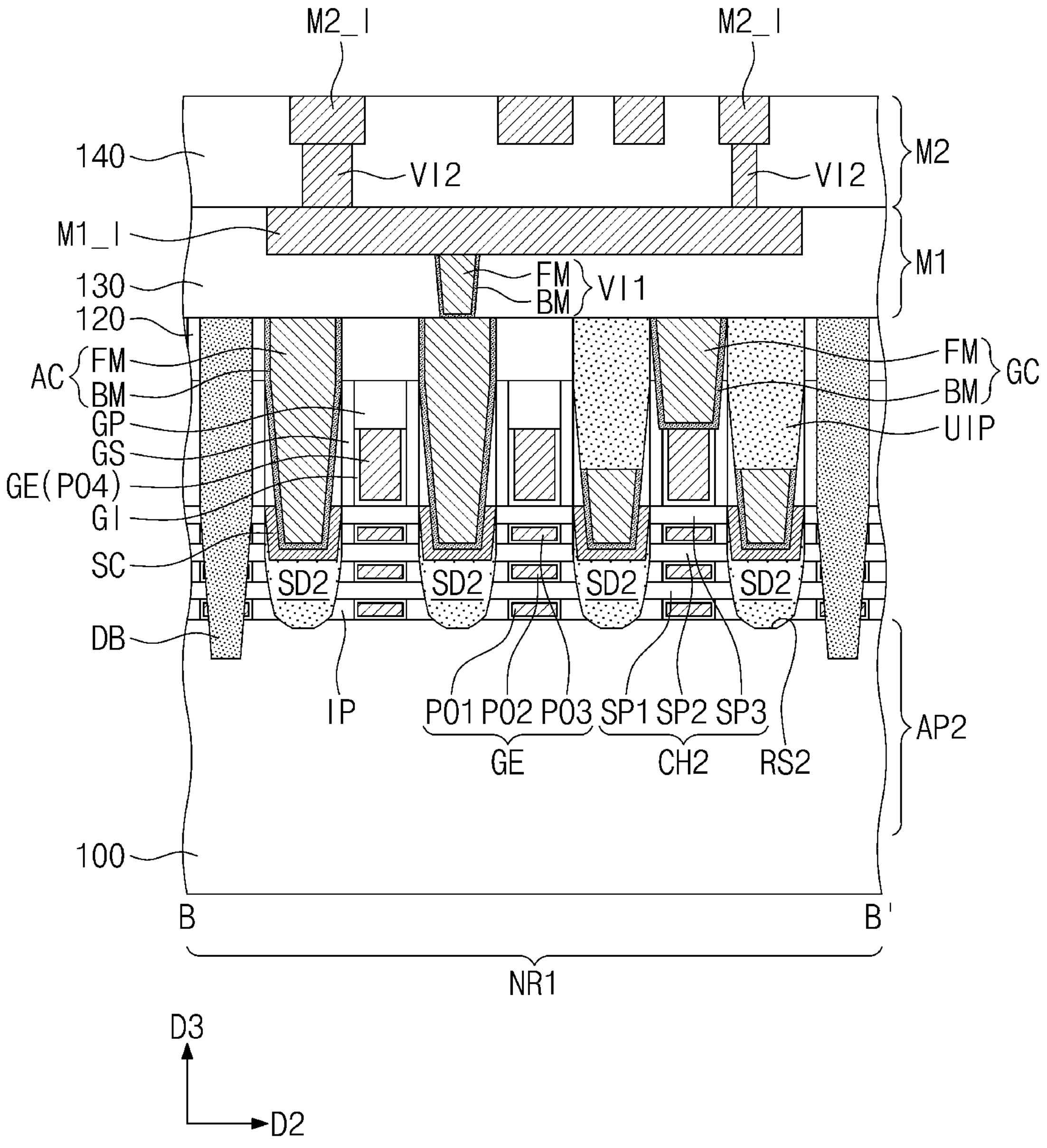
Figure 6:
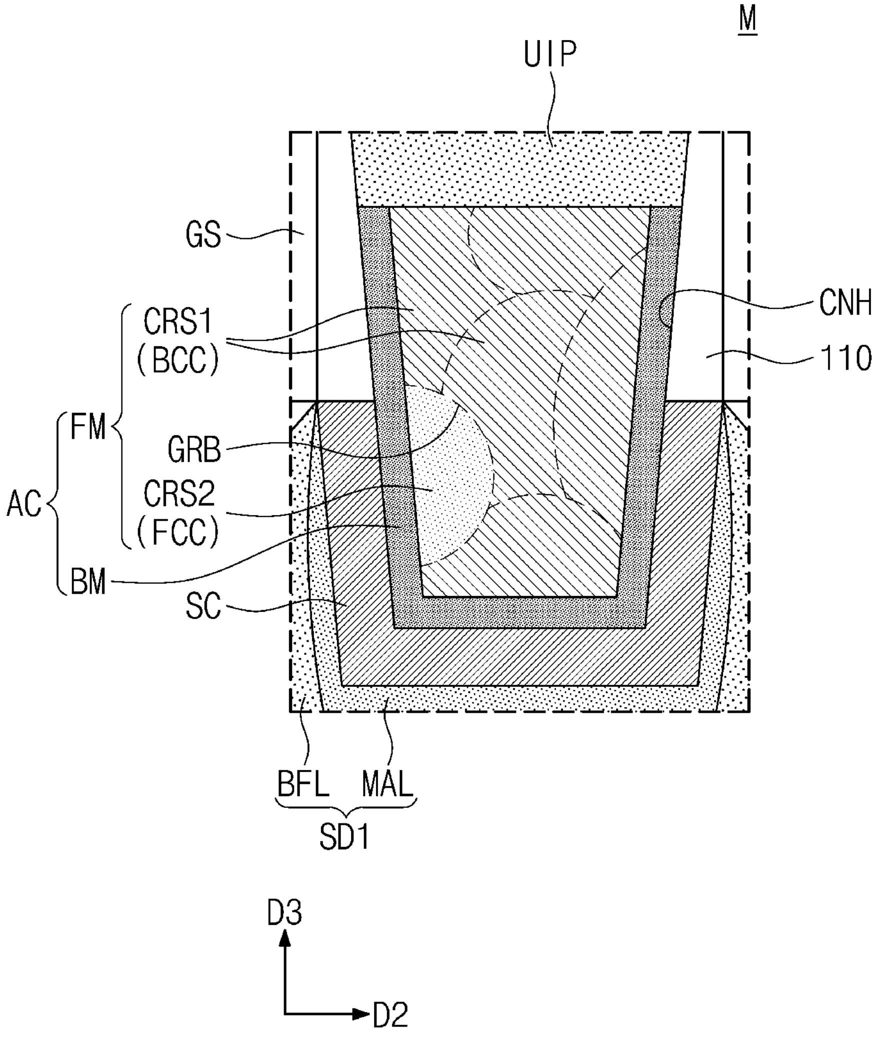
FIG. 6 is an enlarged sectional view illustrating a portion 'M' of FIG. 5A.

In an embodiment, referring to FIGS. 5A and 5B, an upper portion of the active contact AC adjacent to the gate contact GC may be at least partially filled with an upper insulating pattern UIP. A bottom surface of the upper insulating pattern UIP may be lower than a bottom surface of the gate contact GC in the D3 direction with the substrate 100 serving as a base reference layer. In other words, a top surface of the active contact AC adjacent to the gate contact GC may be formed at a level, which is lower than the bottom surface of the gate contact GC in the D3 direction with the substrate 100 serving as a base reference layer, by the upper insulating pattern UIP. Accordingly, it may be possible to prevent or reduce the likelihood of the gate contact GC and the active contact AC, which are adjacent to each other, from being in contact with each other and thereby to prevent or reduce the likelihood of a short circuit issue from occurring therebetween.

Each of the active and gate contacts AC and GC may include a barrier metal BM and a filler metal FM on the barrier metal BM. The barrier metal BM may be provided to enclose all surfaces of the filler metal FM except for a top surface. For example, the filler metal FM may be formed of or include at least one of molybdenum, tungsten, ruthenium, cobalt, or vanadium. In an embodiment, the filler metal FM may be formed of or include molybdenum. The barrier metal BM may include a metal nitride layer. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines MU. The interconnection lines M1_R1, M1_R2, M1_R3, and M1_I of the first metal layer M1 may extend in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

Figure 5C:
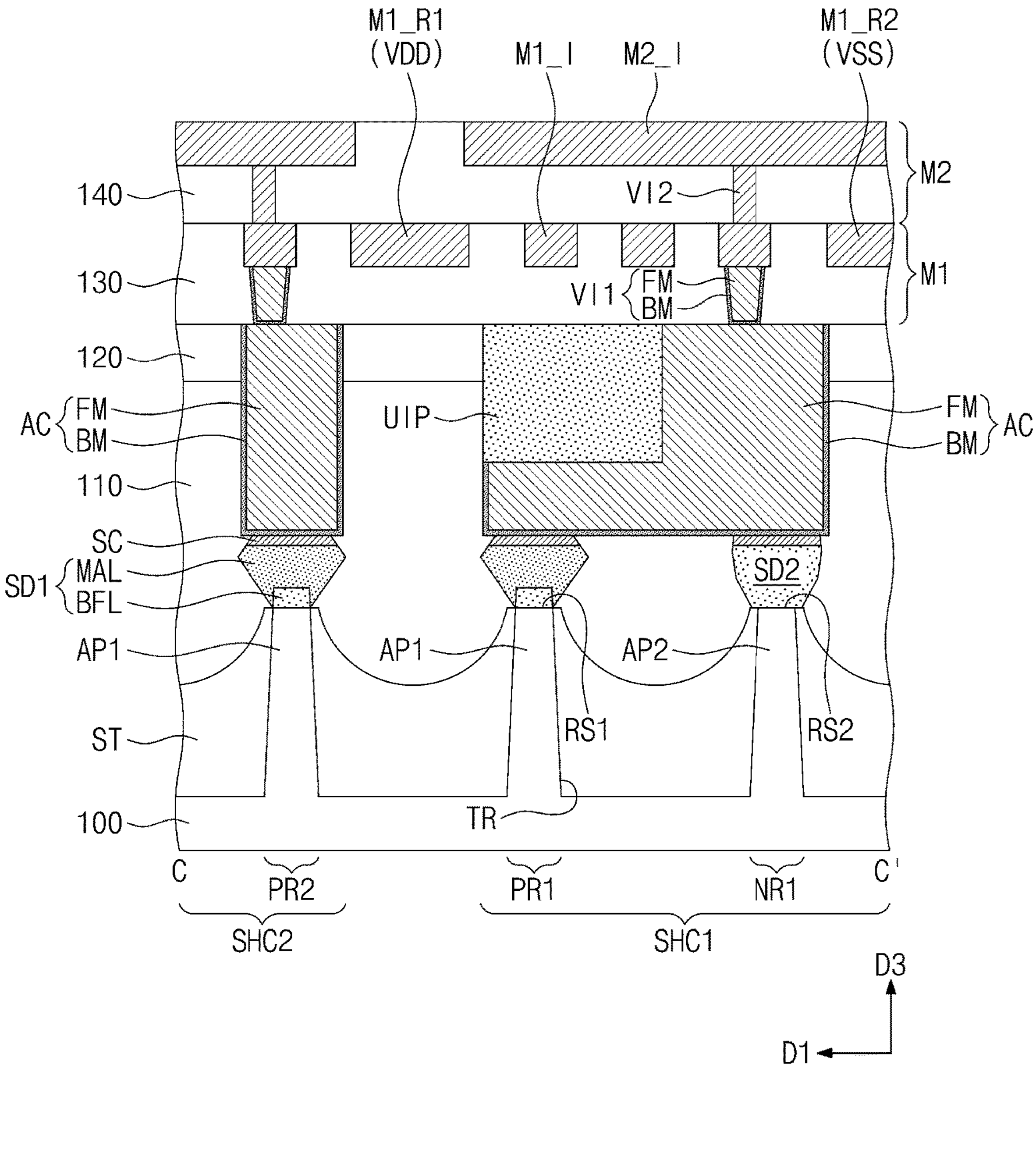
Figure 5D:
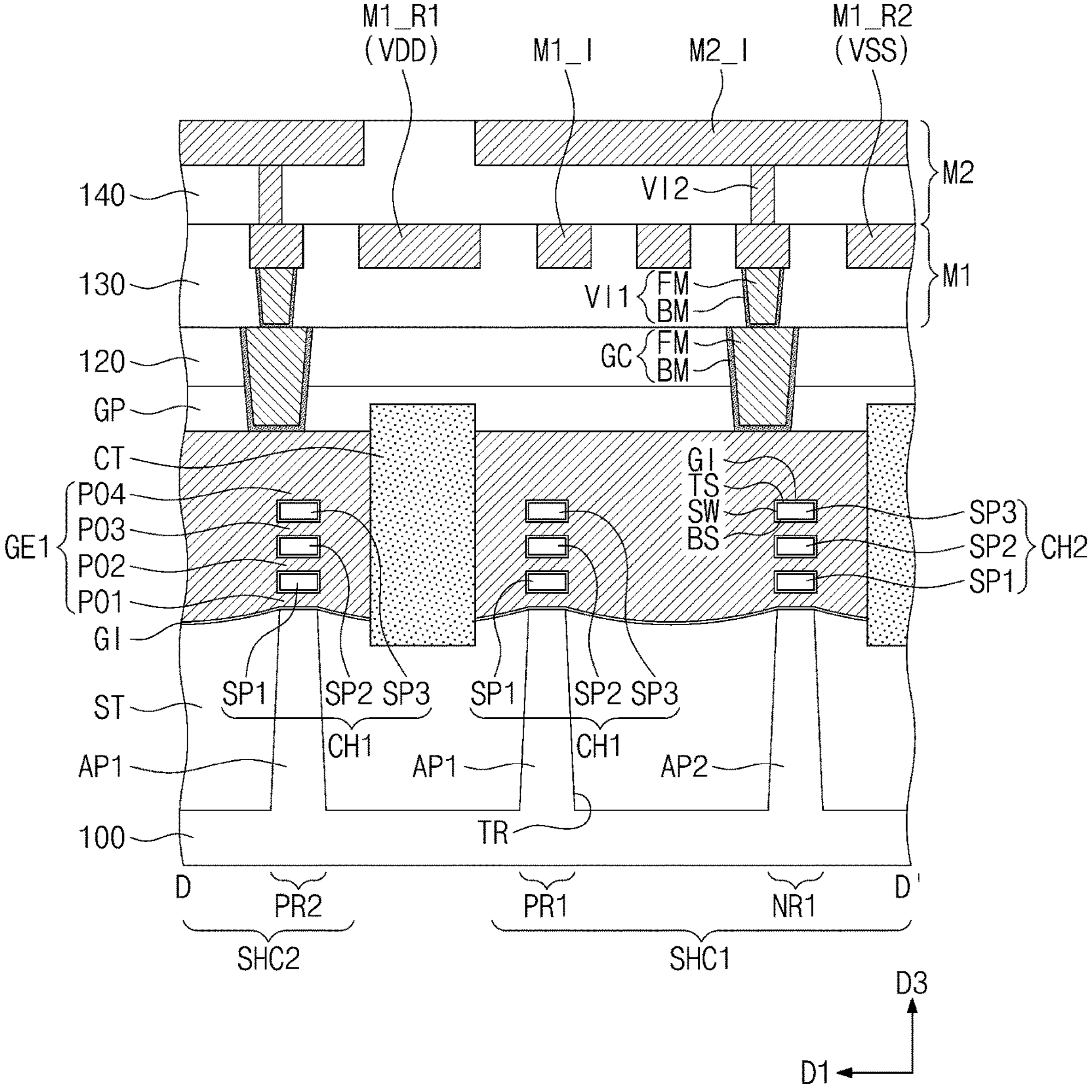

The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first to third power lines M1_R1, M1_R2, and M1_R3 in the D1 direction as shown in FIG. 5C.

The first metal layer M1 may further include first vias VI1. The first vias VI1 may be respectively provided below (i.e., closer to the substrate 100) the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The first via VI1 may include the barrier metal BM and the filler metal FM on the barrier metal BM, like the active and gate contacts AC and GC. The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that extend in the first direction D1. In other words, the second interconnection lines M2_I may extend in the first direction D1 and parallel to each other.

The second metal layer M2 may further include second vias VI2, which are respectively provided below (i.e., closer to the substrate) the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include one or more metallic materials (e.g., copper, ruthenium, aluminum, tungsten, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Hereinafter, the barrier and filler metals BM and FM of the active contact AC will be described in more detail with reference to FIG. 6. The barrier metal BM may be provided on an inner surface of a contact trench CNH of the first interlayer insulating layer 110. The barrier metal BM may have a uniform thickness.

In an embodiment, the barrier metal BM may include a metal nitride layer (e.g., TiN) formed by a PECVD process. In another embodiment, the barrier metal BM may include a metal nitride layer (e.g., TiN), which is formed using a deposition process and then is treated using plasma. For example, the barrier metal BM may be or include a metal nitride layer that is treated by a plasma-using ion bombardment process which is performed during or directly after its deposition process.

As a result of the ion bombardment process, the material (e.g., TiN) of the barrier metal BM may be denser than a TiN layer deposited using a simple CVD process. Since the material (e.g., TiN) of the barrier metal BM has an increased density by the ion bombardment process, it may have a compressive stress.

The filler metal FM may be formed through a deposition process (e.g., ALD), which is performed on the barrier metal BM after the formation of the barrier metal BM. During the formation of the filler metal FM, a crystal structure of the filler metal FM may be affected by the barrier metal BM.

According to an embodiment of the inventive concept, the filler metal FM may be molybdenum and may include a first crystalline region CRS1 and a second crystalline region CRS2. The first crystalline region CRS1 may have a first crystal structure (e.g., a body-centered cubic (BCC) structure). The second crystalline region CRS2 may have a second crystal structure (e.g., a face-centered cubic (FCC) structure).

A grain boundary GRB may be defined between the crystalline regions. The grain boundary GRB may be formed between the first and second crystalline regions CRS1 and CRS2 having different crystalline structures. In addition, the grain boundary GRB may be formed between the first crystalline regions CRS1, which are adjacent to each other and have the same crystalline structure.

A proportion of the first crystalline regions CRS1 in the filler metal FM may range from 60% to 99%. In other words, a ratio of a volume of the first crystalline regions CRS1 to a total volume of the filler metal FM may range from 60% to 99%. For example, the two-dimensional section shown in FIG. 6, a ratio of an area of the first crystalline regions CRS1 to a total area of the filler metal FM may range from 60% to 99%. A fraction or proportion of the BCC structure in the filler metal FM may range from 60% to 99%. The second crystalline region CRS2 may correspond to a remaining region of the filler metal FM except for the first crystalline regions CRS1.

According to an embodiment of the inventive concept, 60% to 99% of a crystal structure in the filler metal FM (i.e., molybdenum) may be a BCC structure. More specifically, 80% to 99% of a crystal structure in the filler metal FM (i.e., molybdenum) may be a BCC structure.

In the case where the proportion of the BCC structure in the filler metal FM (i.e., molybdenum) ranges from 60% to 99% (more specifically, from 80% to 99%), the filler metal FM may have a resistivity of 16 μΩm to 18 μΩcm. According to an embodiment of the inventive concept, since the proportion of the BCC structure in the filler metal FM is higher than 80%, the filler metal FM may have a relatively low resistivity. That is, the active contact AC may have a relatively low resistance, and this may make it possible to improve electrical characteristics of the semiconductor device.

The barrier and filler metals BM and FM according to an embodiment of the inventive concept have been described with reference to the active contact AC. In an embodiment, the gate contact GC and the first via VI1 may also include the barrier and filler metals BM and FM, and in this case, the barrier and filler metals BM and FM in the gate contact GC and the first via VI1 may have the same features as those of the active contact AC described above.

As a result, in a semiconductor device according to an embodiment of the inventive concept, the transistors constituting the logic circuit may be connected to the interconnection lines of the first metal layer M1 thereon with a reduced electric resistance, and this may make it possible to improve electrical characteristics of the semiconductor device.

According to an embodiment of the inventive concept, a proportion of the body-centered cubic (BCC) structure in the filler metal FM of the active contact AC may be higher than a proportion of the body-centered cubic (BCC) structure in the filler metal FM of each of the gate contact GC and the first via VI1. In this case, resistivity of the filler metal FM may be lower in the active contact AC than in each of the gate contact GC and the first via VI1. This is because the active contact AC is provided in the form of a contact plug at least partially filling a relatively wide trench (e.g., see FIG. 5C) whereas each of the gate contact GC and the first via VI1 is provided in the form of a contact plug may at least partially fill a relatively narrow hole (e.g., see FIG. 5D).

FIGS. 7A to 14D are sectional views illustrating a method of fabricating a semiconductor device according to an embodiment of the inventive concept. In detail, FIGS. 7A, 8A, 9A, 10A, 11A, 12A, 13A, and 14A are sectional views corresponding to a line A-A' of FIG. 4. FIGS. 9B, 10B, 11B, 12B, 13B, and 14B are sectional views corresponding to a line B-B' of FIG. 4. FIGS. 9C, 10C, 11C, 12C, 13C, and 14C are sectional views corresponding to a line C-C' of FIG. 4. FIGS. 7B, 8B, 9D, 10D, 11D, 12D, 13D, and 14D are sectional views corresponding to a line D-D' of FIG. 4.

Figure 7A:
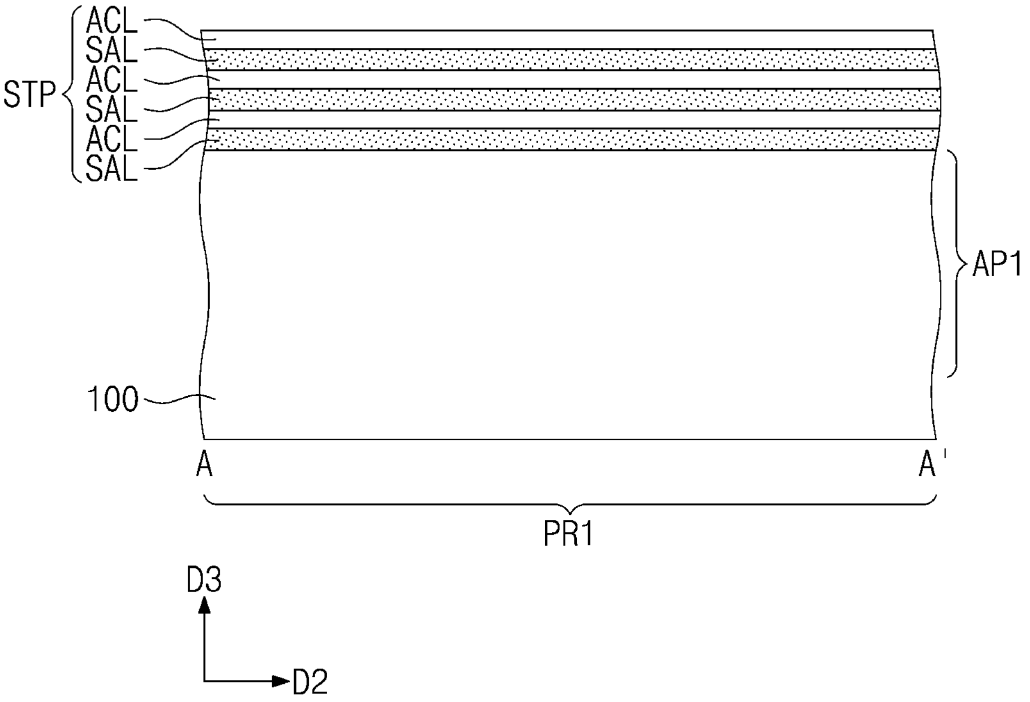
FIGS. 7A to 14D are sectional views illustrating a method of fabricating a semiconductor device according to an embodiment of the inventive concept.
Figure 7B:
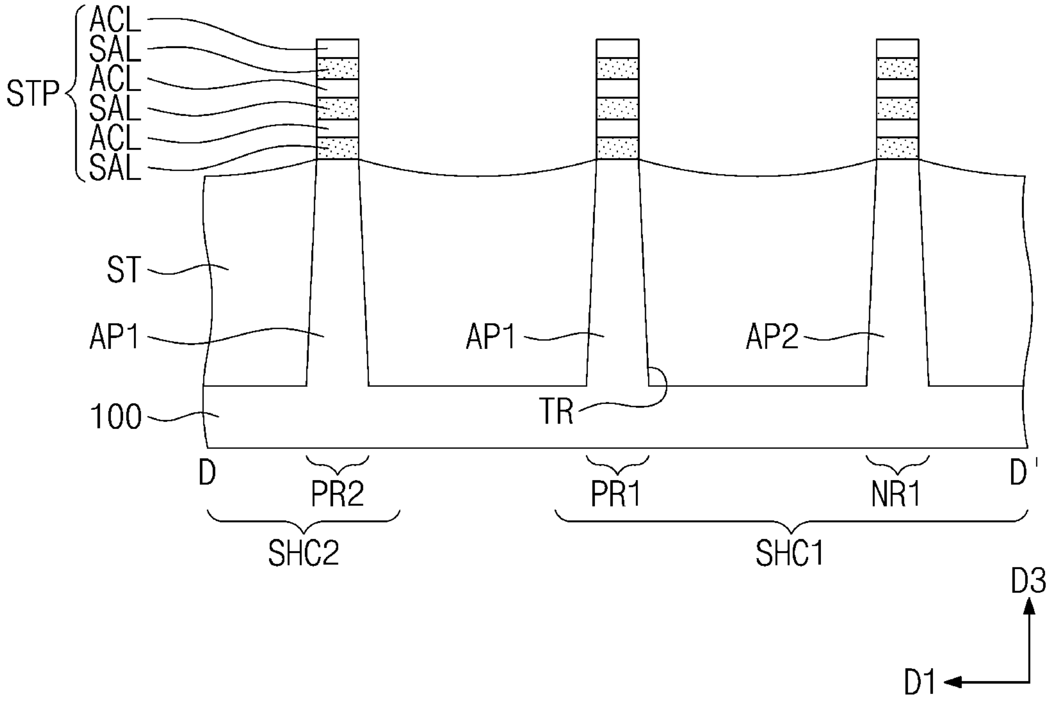

Referring to FIGS. 7A and 7B, the substrate 100 may be provided, and in an embodiment, the substrate may include the first and second PMOSFET regions PR1 and PR2 and the first and second NMOSFET regions NR1 and NR2. Active layers ACL and the sacrificial layers SAL may be alternately stacked on the substrate 100. The active layers ACL may be formed of or include silicon (Si), germanium (Ge), and/or silicon germanium (SiGe), and the sacrificial layers SAL may be formed of or include silicon (Si), germanium (Ge), and/or silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line- or bar-shaped pattern that extends in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2 during the patterning process.

The device isolation layer ST may be formed to at least partially fill the trench TR. In detail, an insulating layer may be formed on the substrate 100 to at least partially cover the first and second active patterns AP1 and AP2 and the stacking patterns STP. The device isolation layer ST may be formed by recessing the insulating layer to expose at least a portion of the stacking patterns STP.

The device isolation layer ST may be formed of or include at least one insulating material (e.g., silicon oxide). The stacking patterns STP may be placed above the device isolation layer ST in the D3 direction as shown in FIG. 7B and may be exposed to the outside of the device isolation layer ST. In other words, the stacking patterns STP may protrude vertically, i.e., the D3 direction, above the device isolation layer ST.

Figure 8A:
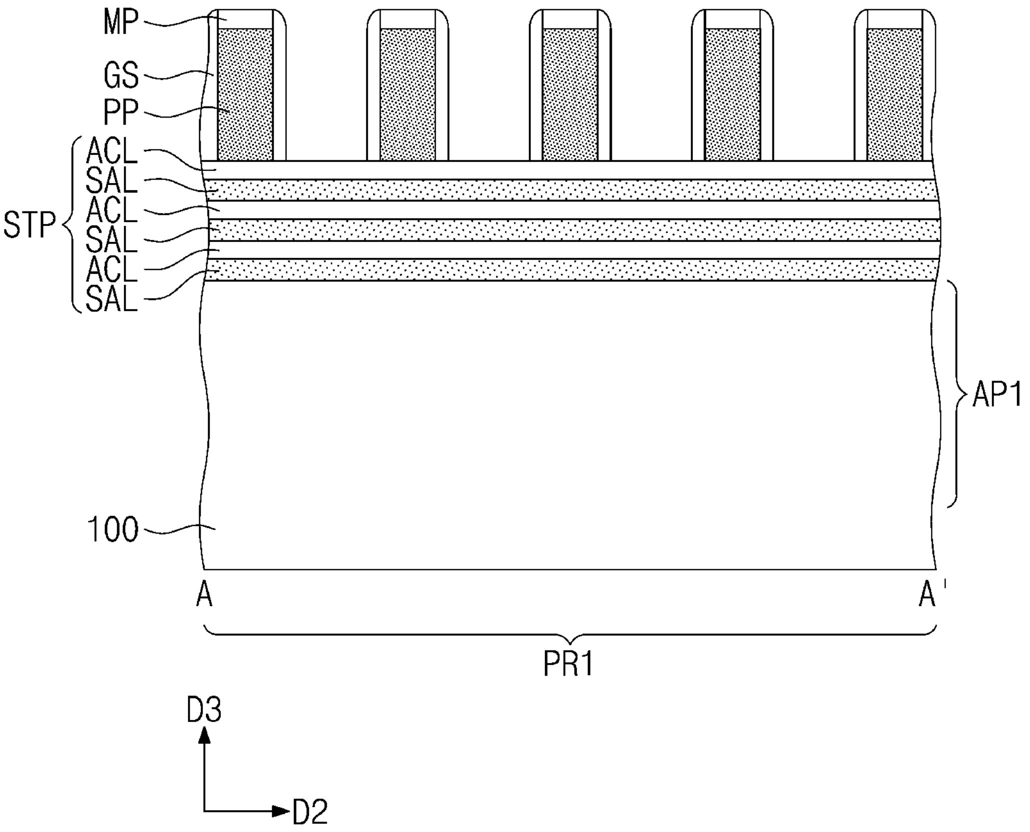
Figure 8B:
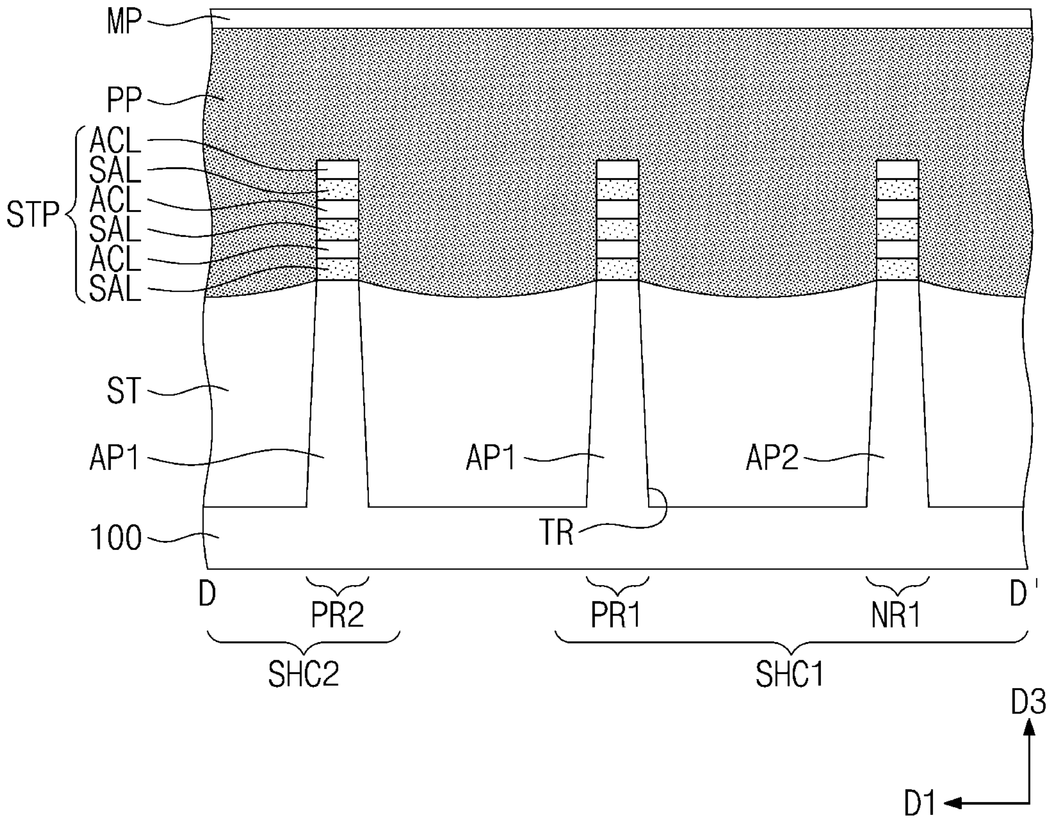
Figure 9A:
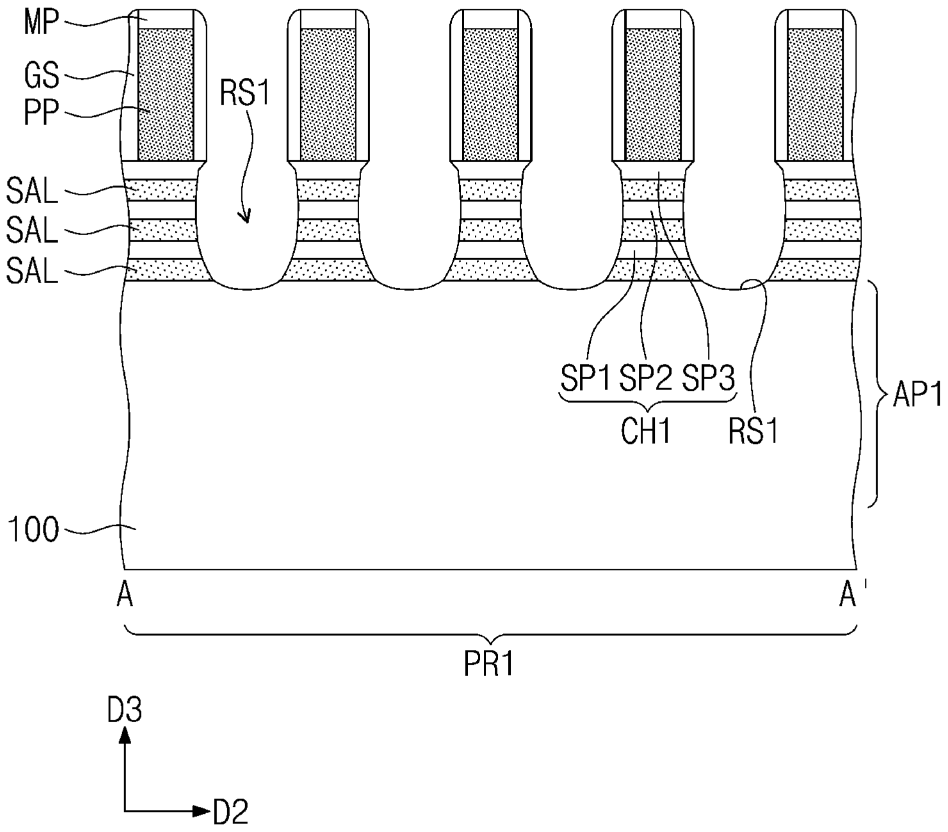
Figure 9B:
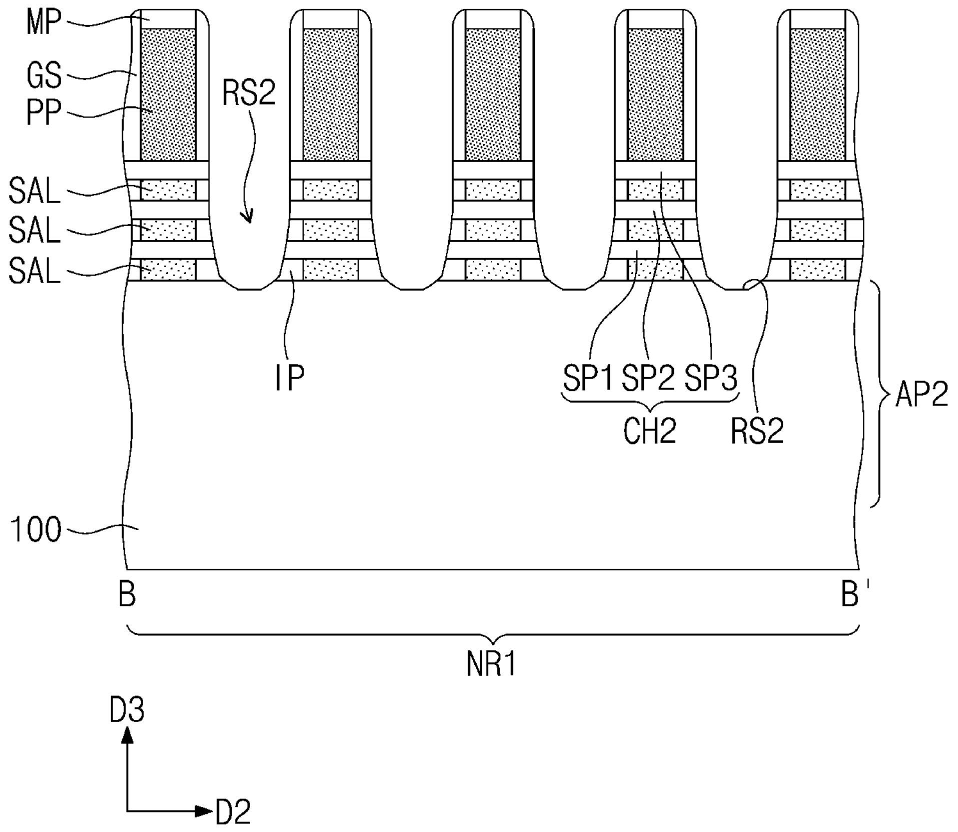
Figure 9C:
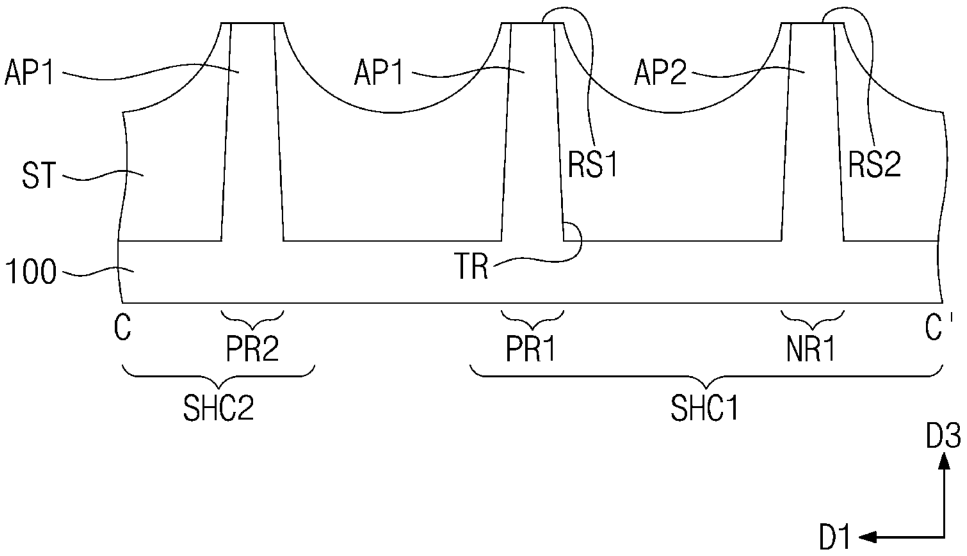
Figure 9D:
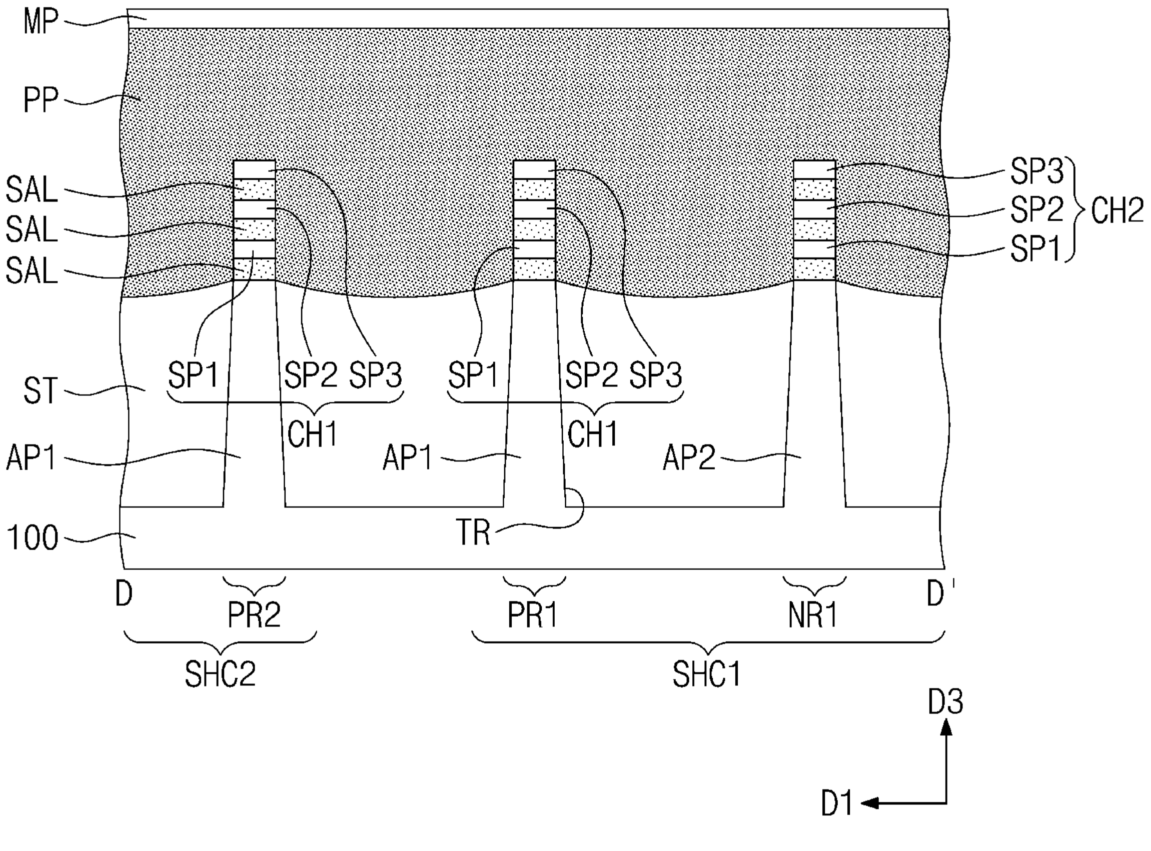
Figure 10A:
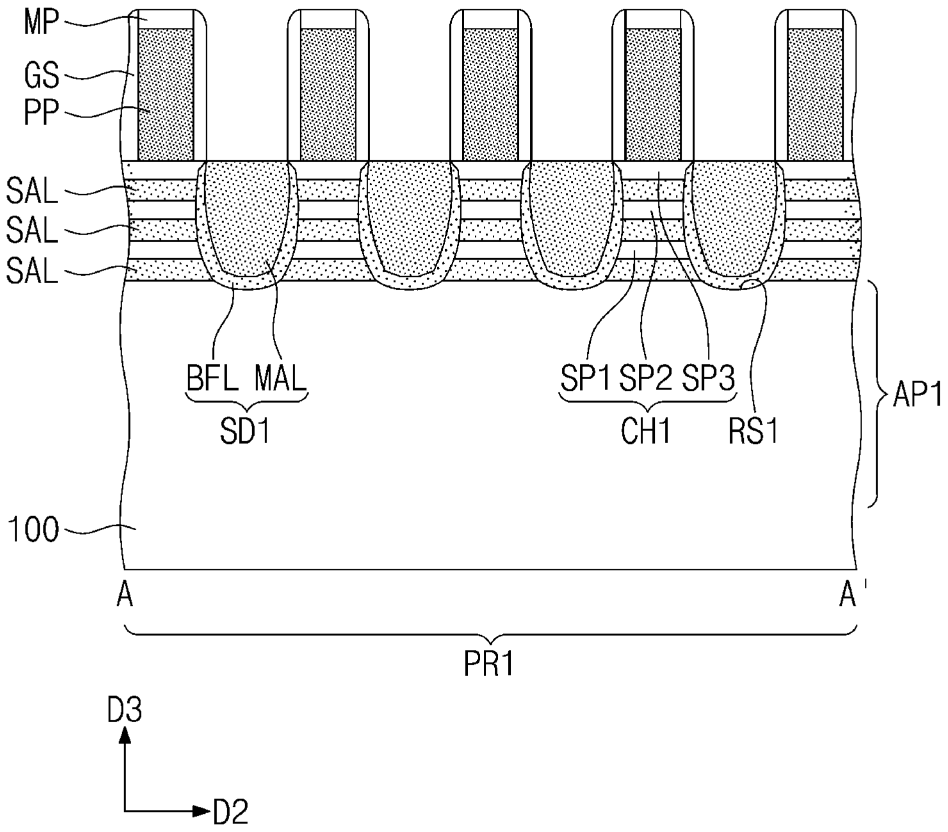
Figure 10B:
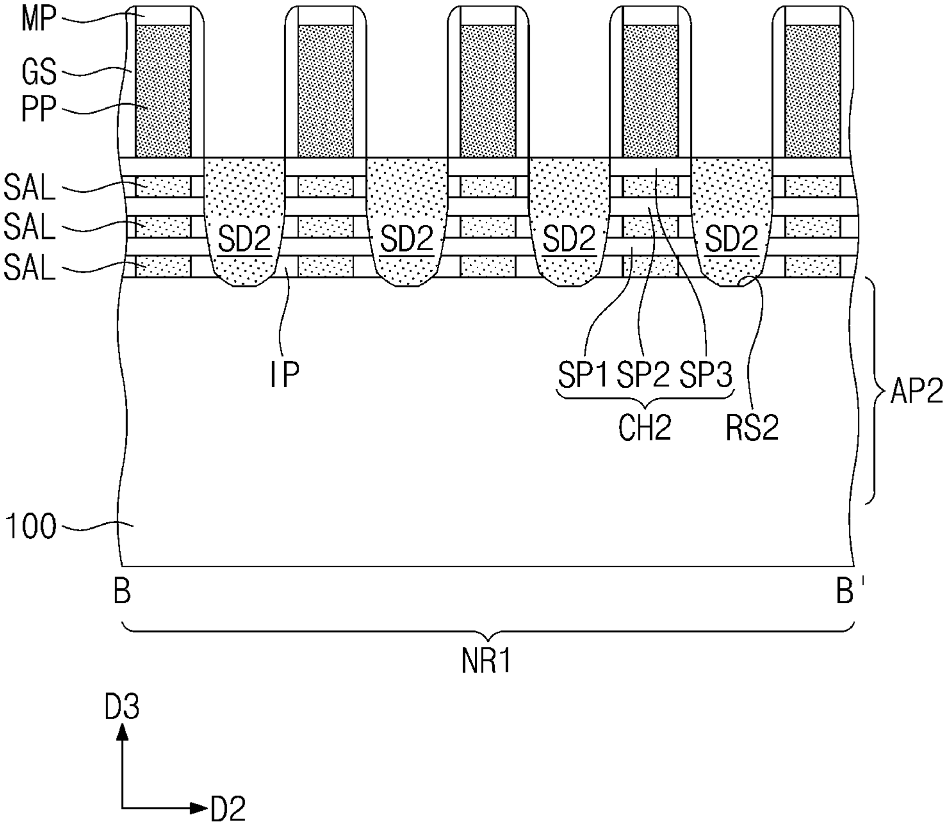
Figure 10C:
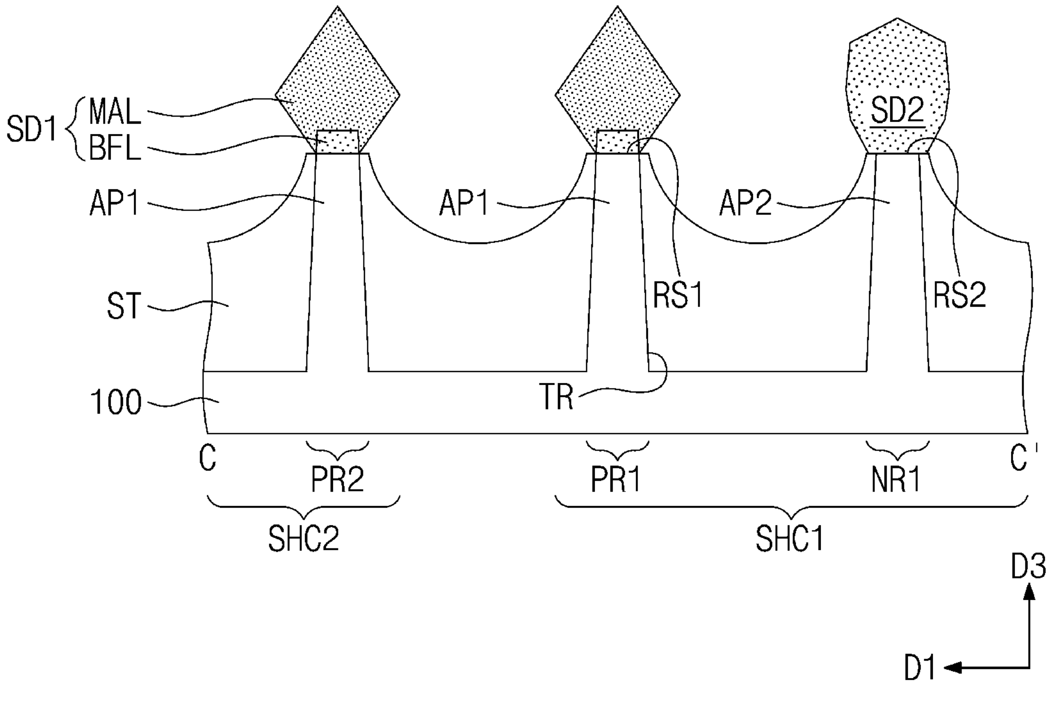
Figure 10D:
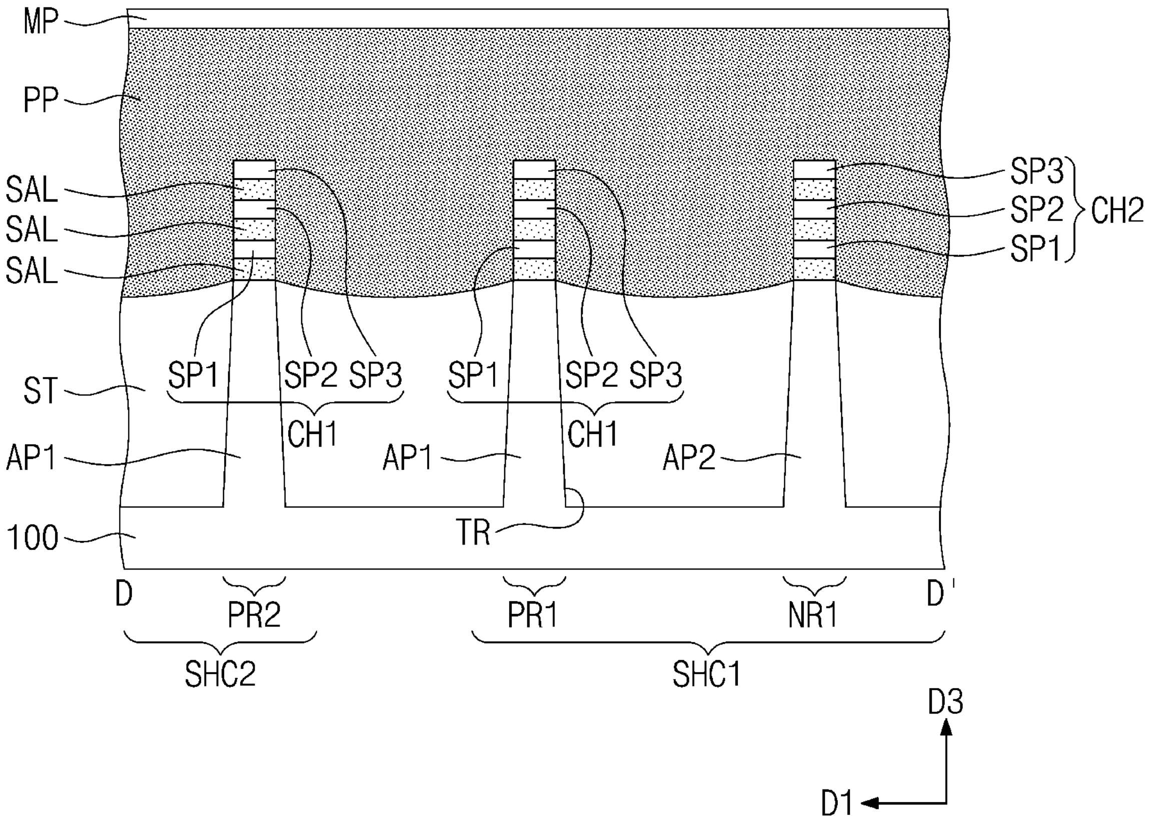
Figure 11A:
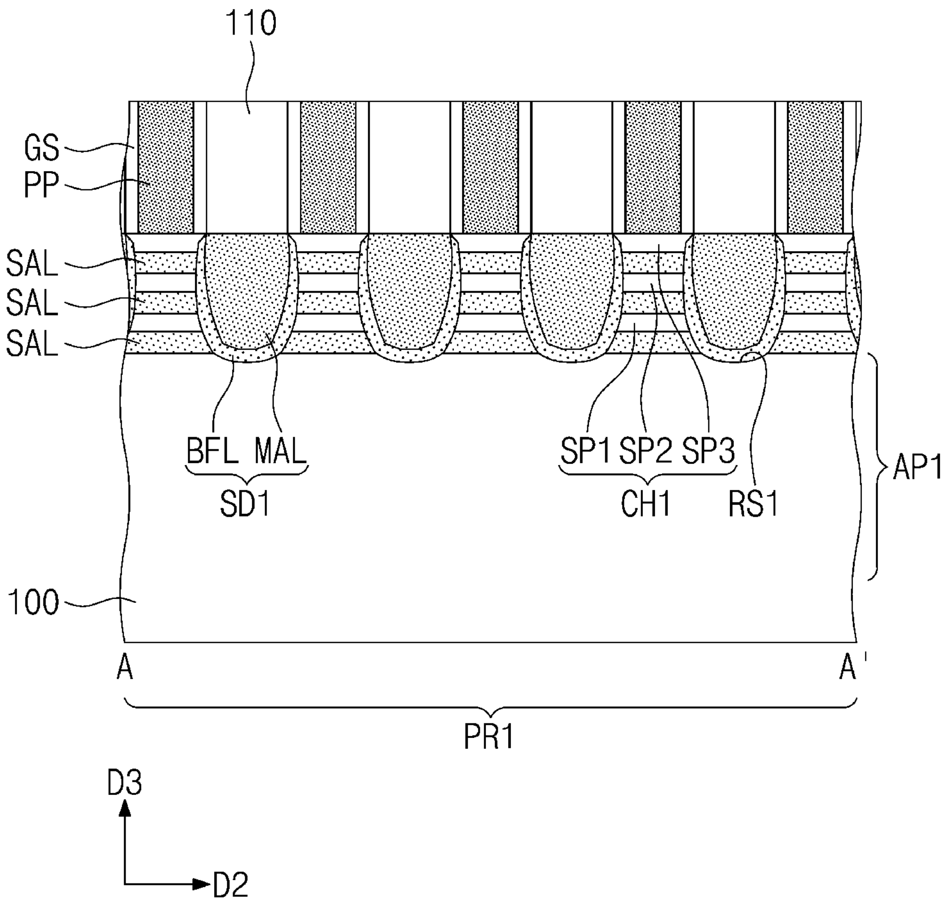
Figure 11B:
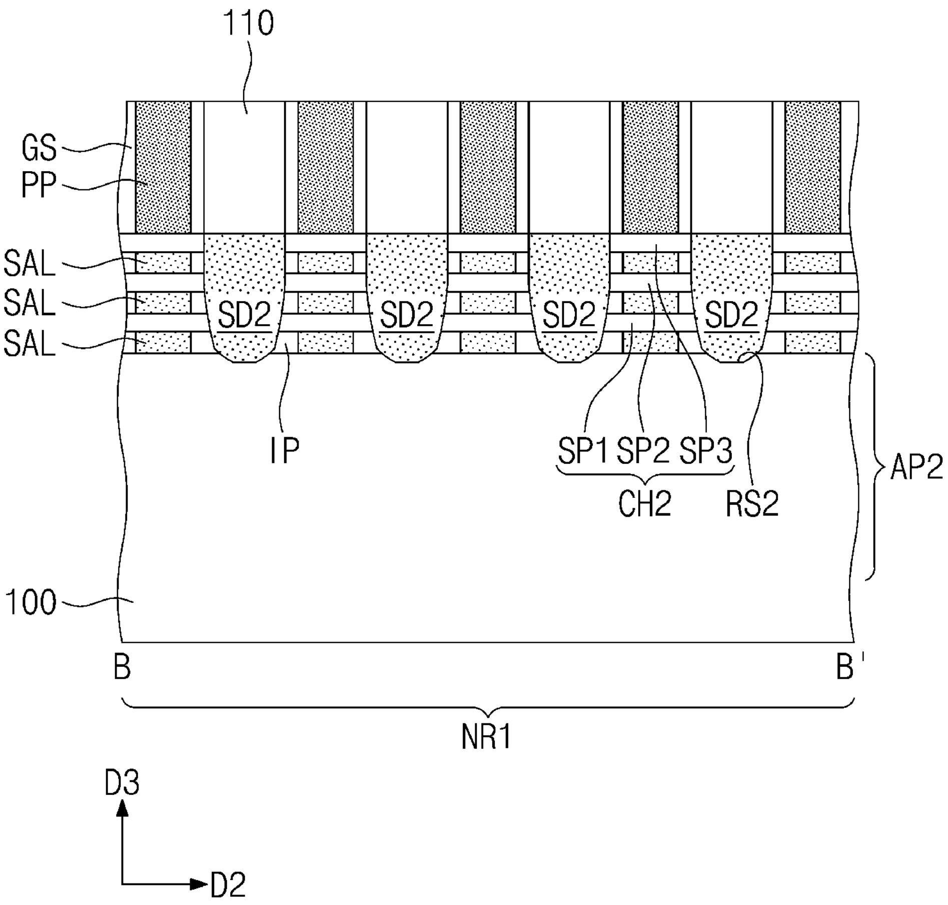
Figure 11C:
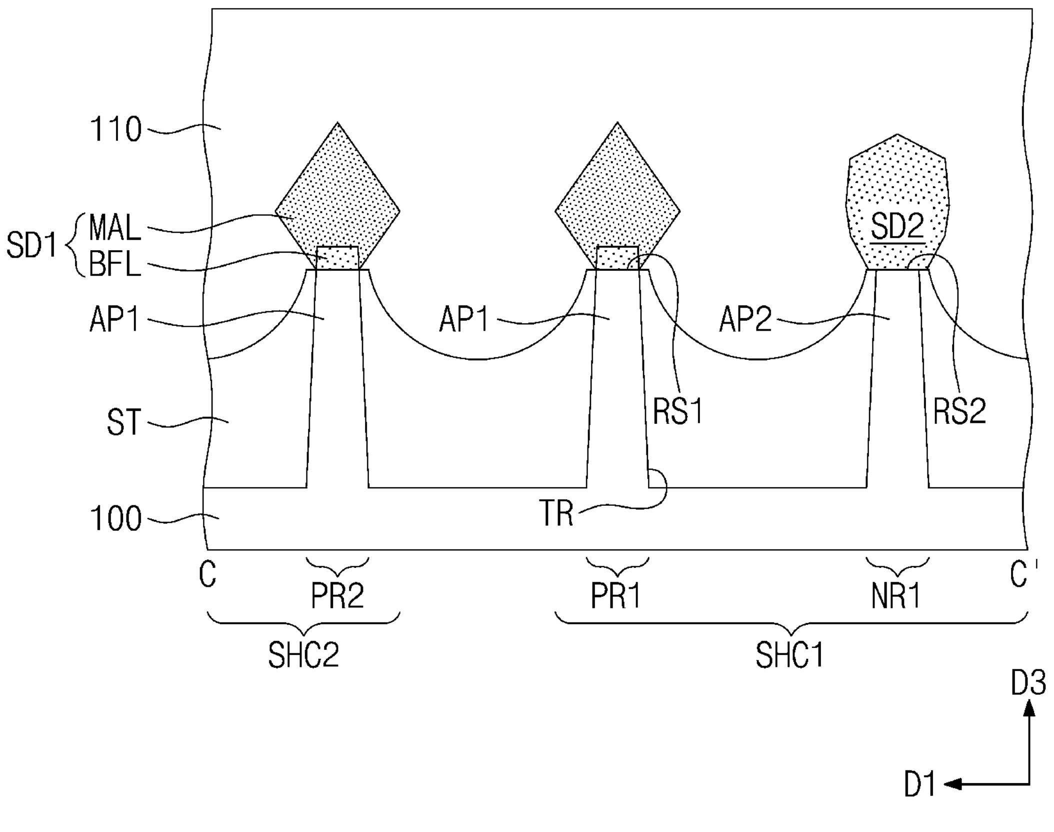
Figure 11D:
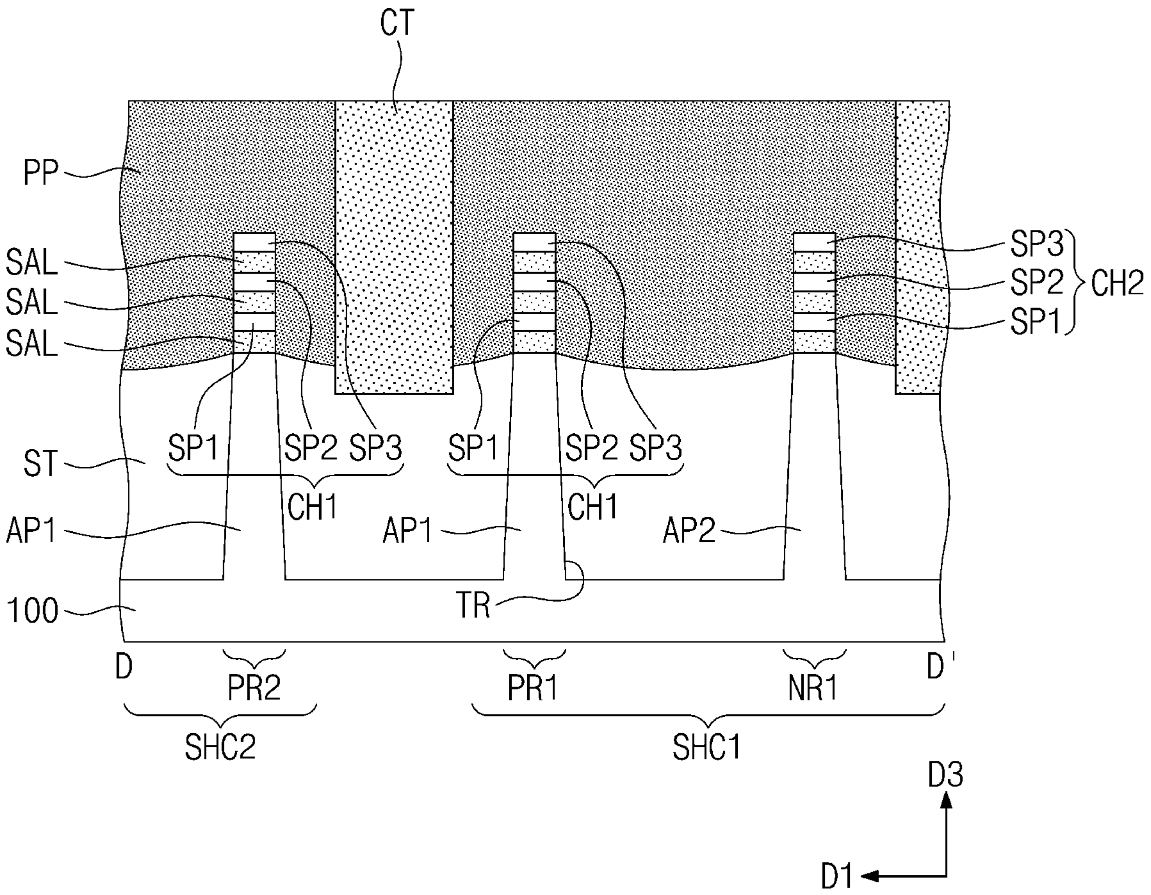

Referring to FIGS. 8A and 8B, sacrificial patterns PP may be formed on the substrate 100 to cross the stacking patterns STP. Each of the sacrificial patterns PP may be a line- or bar-shaped pattern that extends in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. For example, the sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

Referring to FIGS. 9A to 9D, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP.

The second recesses RS2 in the stacking pattern STP on the second active pattern AP2 may be formed by the same method as that for the first recesses RS1. The formation of the second recess RS2 may further include forming the inner spacers IP in recessed regions that are formed by selectively etching the sacrificial layer SAL.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3, which are sequentially stacked between adjacent ones of the second recesses RS2, may be respectively formed from the active layers ACL. The first to third semiconductor patterns SP1, SP2, and SP3 between the adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

Referring to FIGS. 10A to 10D, the first source/drain patterns SD1 may be formed in the first recesses RS1, respectively. In detail, the buffer layer BFL may be formed by a first SEG process using an inner surface of the first recess RS1 as a seed layer. The buffer layer BFL may be grown using the first to third semiconductor patterns SP1, SP2, and SP3 and the substrate 100, which are at least partially exposed through the first recess RS1, as a seed layer. In an embodiment, the first SEG process may include a chemical vapor deposition (CVD) process or a molecular beam epitaxy (MBE) process.

The buffer layer BFL may contain a semiconductor material (e.g., SiGe) whose lattice constant is greater than that of a semiconductor material of the substrate 100. The buffer layer BFL may contain a relatively low concentration of germanium (Ge). In an embodiment, the buffer layer BFL may contain only silicon (Si) without germanium (Ge). The germanium concentration of the buffer layer BFL may range from 0 at % to 10 at %.

A second SEG process may be performed on the buffer layer BFL to form the main layer MAL. The main layer MAL may be formed to at least partially fill the first recess RS1. The main layer MAL may contain a relatively high concentration of germanium. In an embodiment, the germanium concentration of the main layer MAL may range from 30 at % to 70 at %.

The first source/drain pattern SD1 may be doped in-situ with p-type impurities (e.g., boron, gallium, or indium) during the formation of the buffer and main layers BFL and MAL. In other embodiments, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a third SEG process, in which an inner surface of the second recess RS2 is used as a seed layer. In an embodiment, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). In other embodiments, impurities may be injected into the second source/drain pattern SD2, after the formation of the second source/drain pattern SD2.

Referring to FIGS. 11A to 11D, the first interlayer insulating layer 110 may be formed to at least partially cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to at least partially expose the top surfaces of the sacrificial patterns PP. The planarization of the first interlayer insulating layer 110 may be performed using an etch-back or chemical-mechanical polishing (CMP) process. Most or all of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by at least partially filling a space, which is formed by removing the sacrificial pattern PP, with an insulating material.

Referring to FIGS. 12A to 12D, the exposed sacrificial patterns PP may be selectively removed. As a result of the removal of the sacrificial patterns PP, an outer region ORG at least partially exposing the first and second channel patterns CH1 and CH2 may be formed (e.g., see FIG. 12D). The removal of the sacrificial patterns PP may include a wet etching process, which is performed using an etching solution capable of selectively etching polysilicon.

Figure 12A:
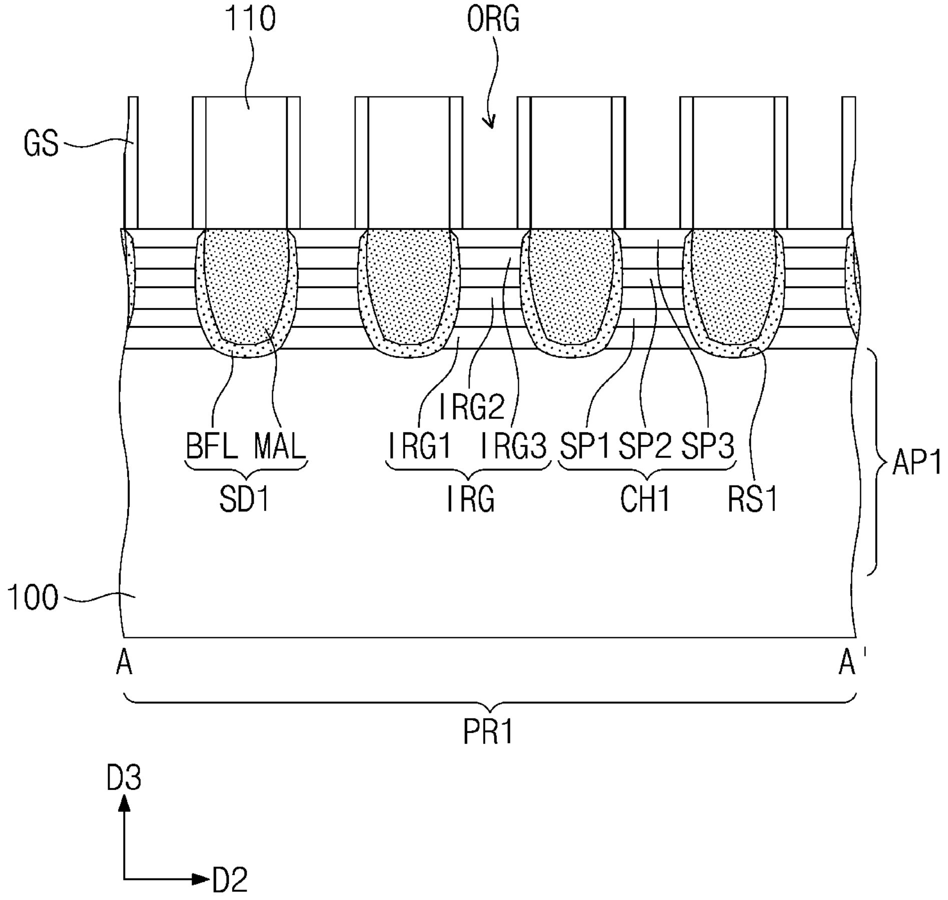
Figure 12B:
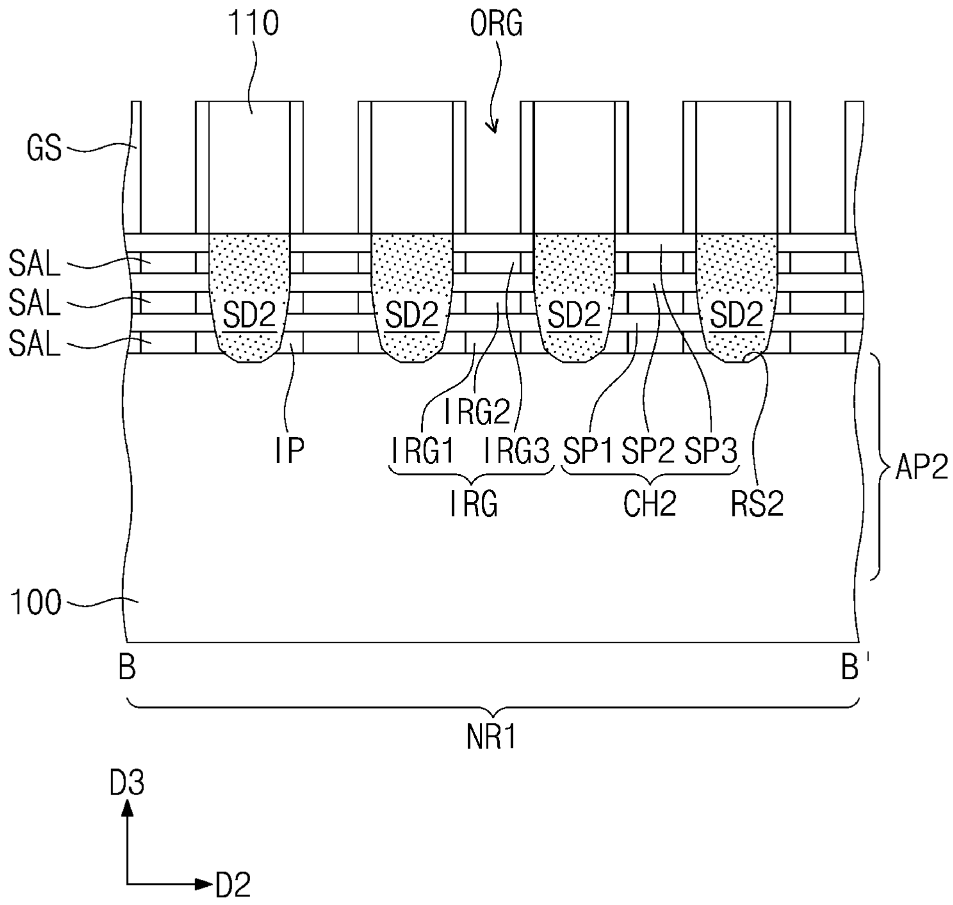
Figure 12C:
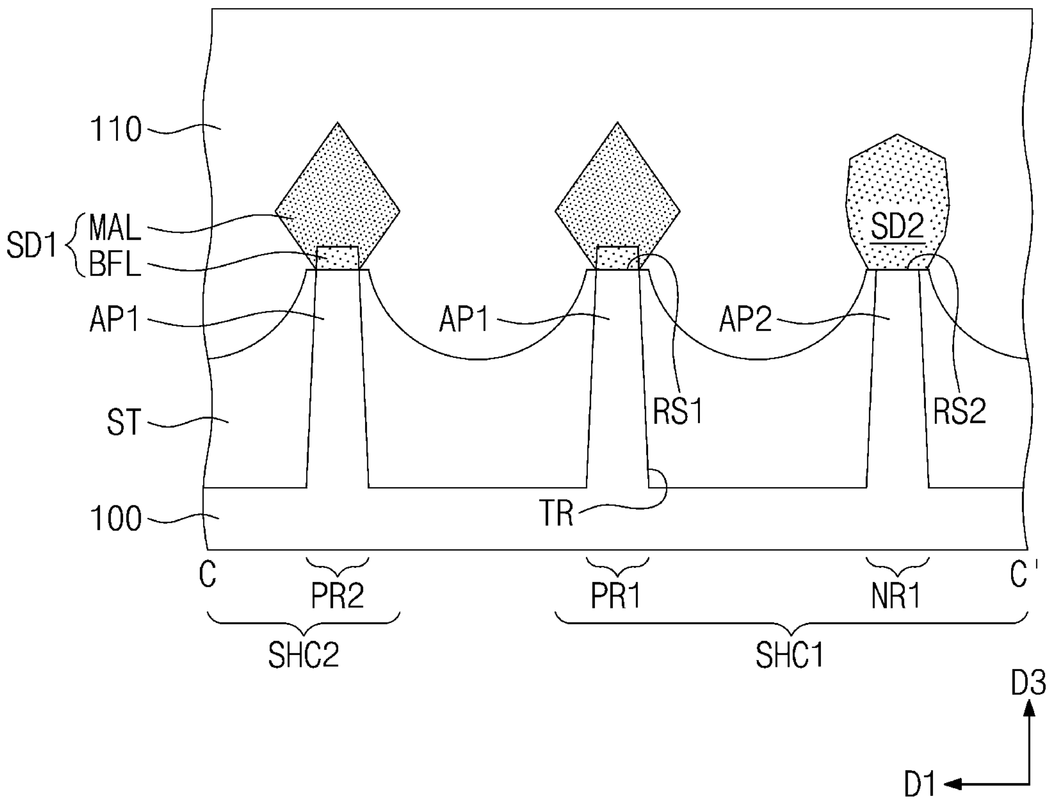
Figure 12D:
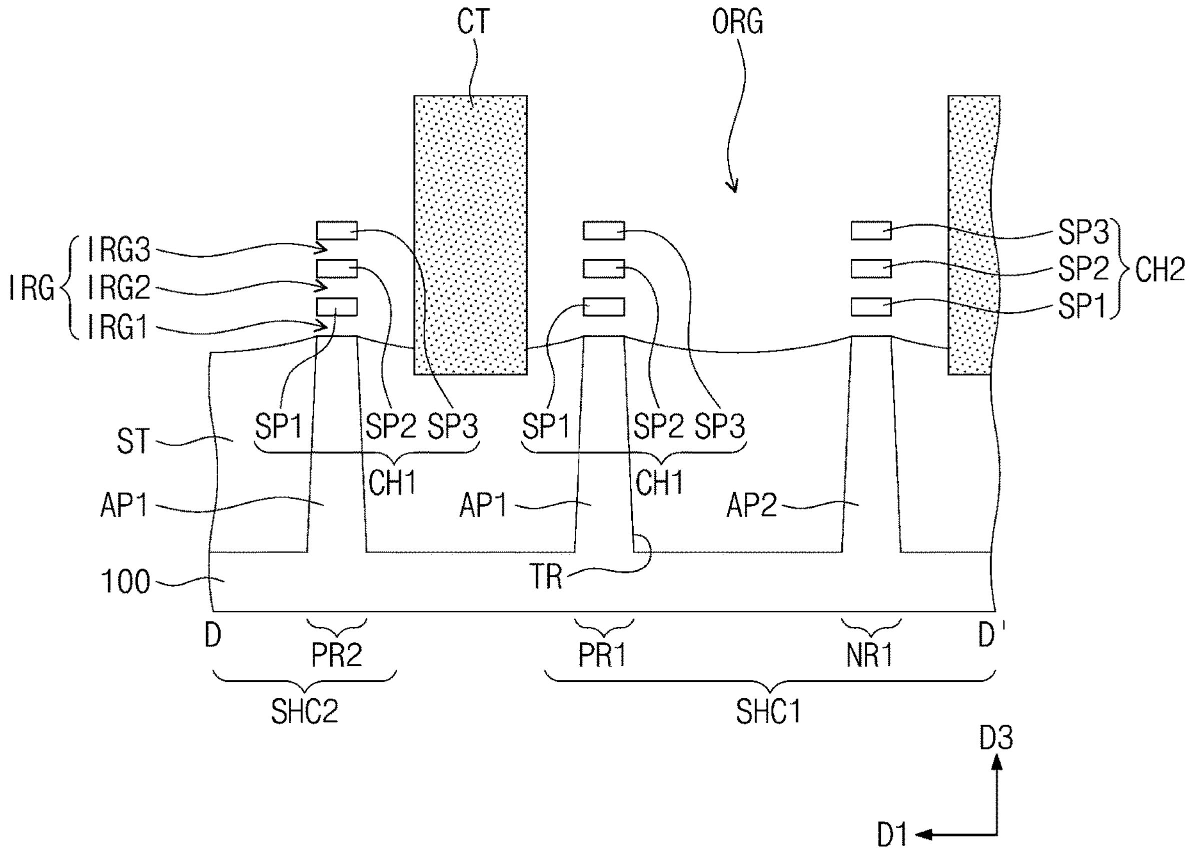
Figure 13A:
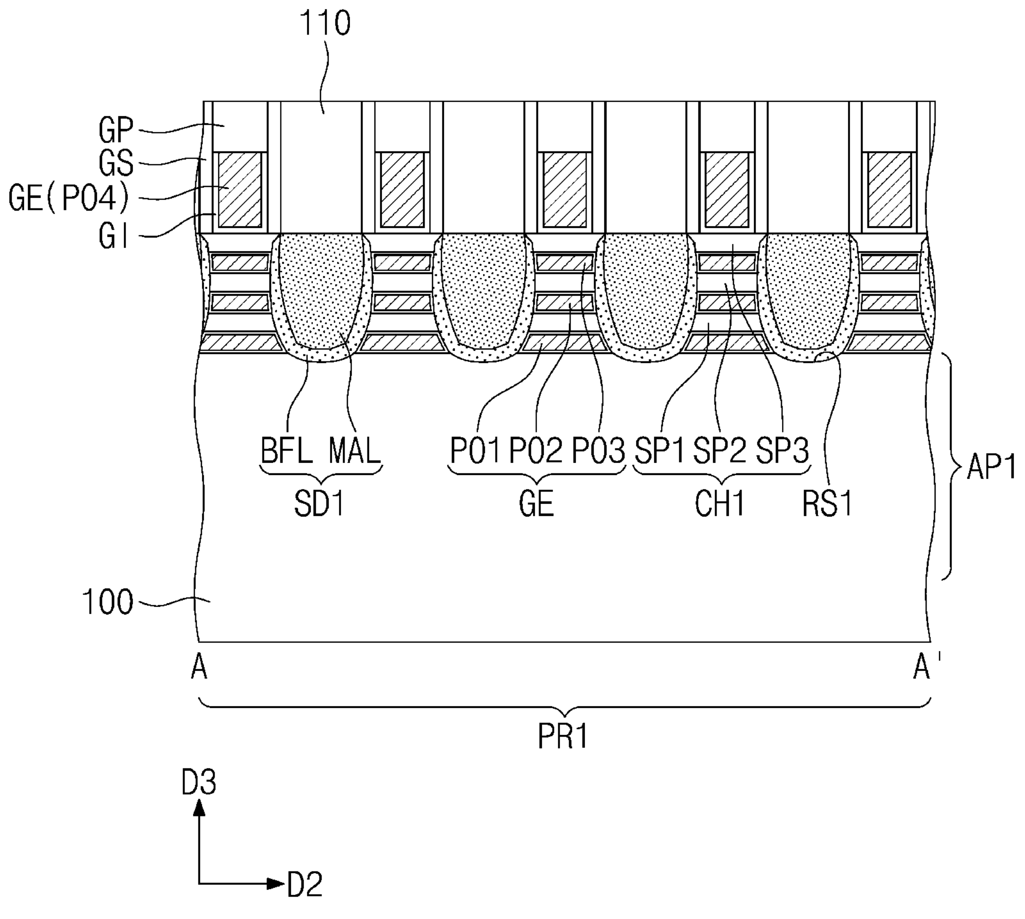
Figure 13B:
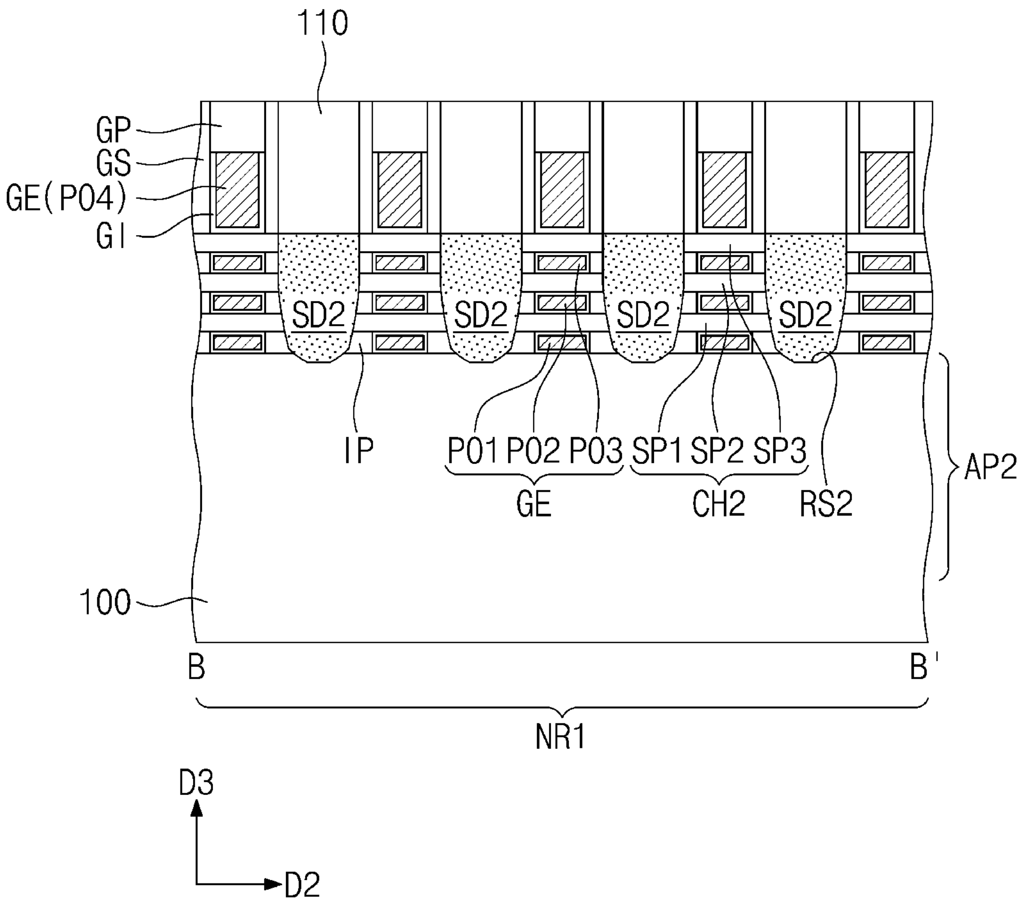
Figure 13C:
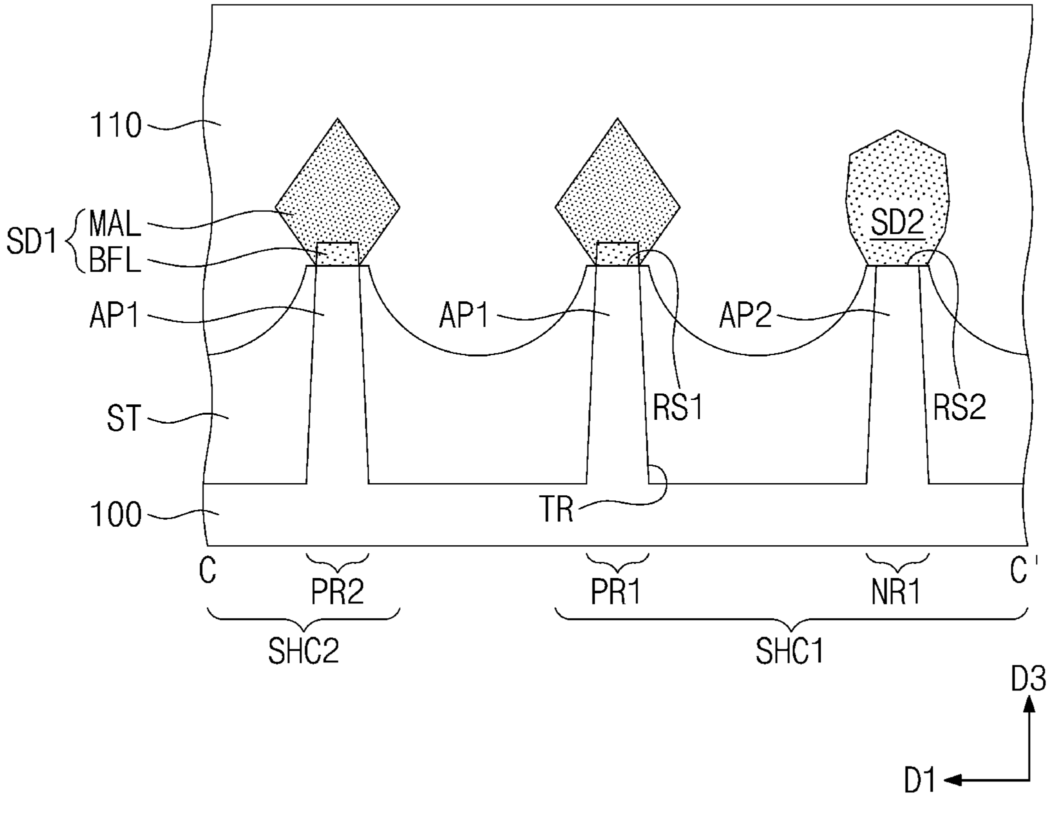
Figure 13D:
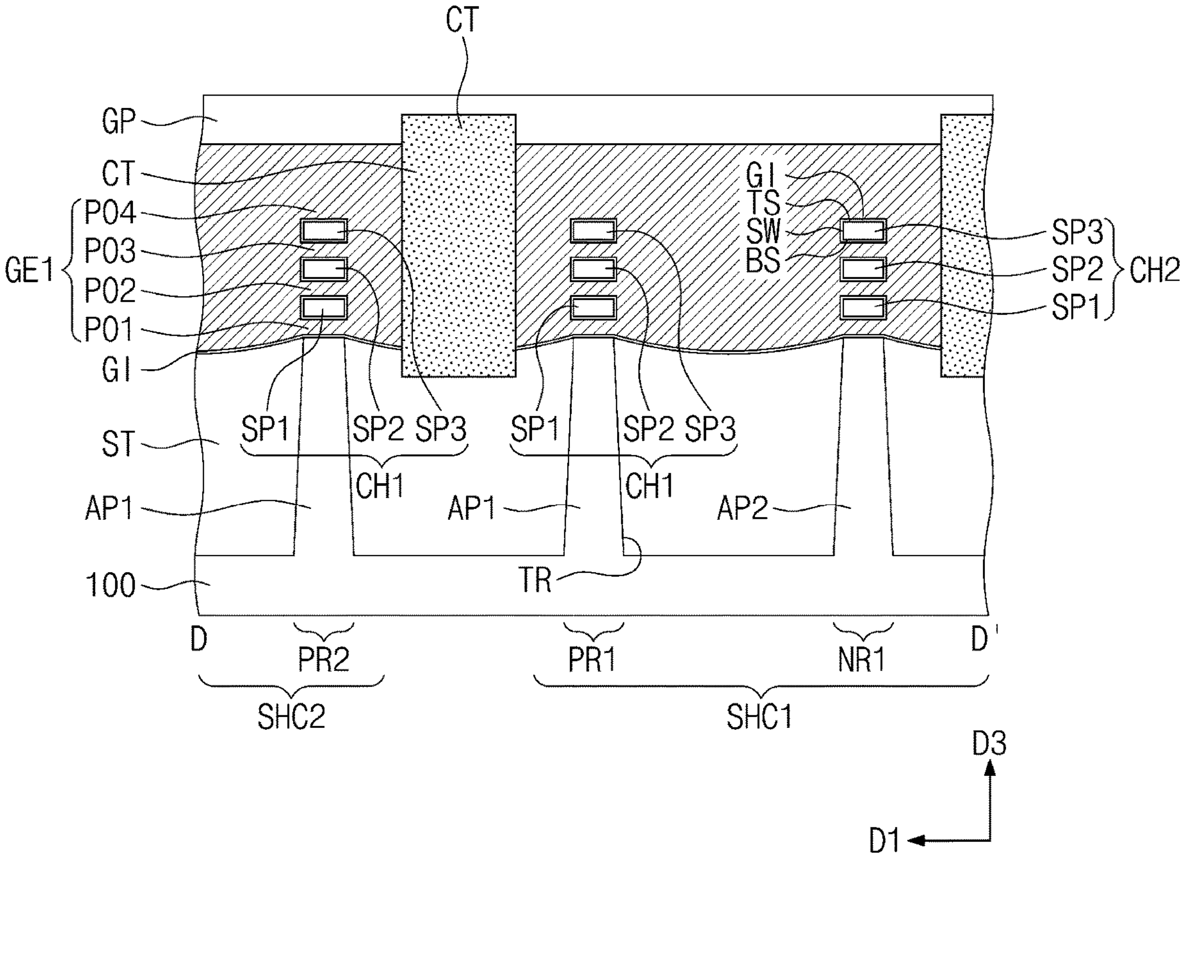

The sacrificial layers SAL exposed through the outer region ORG may be selectively removed to form inner regions IRG (e.g., see FIG. 12D). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to remove the sacrificial layer SAL having a relatively high germanium concentration. Meanwhile, the first source/drain pattern SD1 on the first and second PMOSFET regions PR1 and PR2 may be protected from the etching process by the buffer layer BFL having a relatively low germanium concentration.

Referring back to FIG. 12D, because the sacrificial layers SAL are selectively removed, only the first to third semiconductor patterns SP1, SP2, and SP3, which are stacked on each of the first and second active patterns AP1 and AP2, may be left. Empty regions, which are formed by removing the sacrificial layers SAL, may form first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 13A to 13D, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. Upper portions of the first and second gate cutting patterns CT1 and CT2 may be slightly recessed, during the recessing of the gate electrode GE. The gate capping pattern GP may be formed on the recessed gate electrode GE.

Referring to FIGS. 14A to 14D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contacts GC may be formed to penetrate the second interlayer insulating layer 120 and the gate capping pattern GP and to be electrically connected to the gate electrodes GE, respectively.

The forming of each of the active and gate contacts AC and GC may include forming the barrier metal BM and forming the filler metal FM on the barrier metal BM. The barrier metal BM may be conformally formed and may include a metal layer and a metal nitride layer. The filler metal FM may be formed of or include one or more low resistance metals.

A pair of the division structures DB may be formed at both sides of each of the first and second single height cells SHC1 and SHC2. The division structure DB may penetrate the second interlayer insulating layer 120 and the gate electrode GE and may extend into the active pattern AP1 or AP2. The division structure DB may be formed of or include an insulating material (e.g., silicon oxide or silicon nitride).

Referring back to FIGS. 5A to 5D, the third interlayer insulating layer 130 may be formed on the active contacts AC and the gate contacts GC. The first metal layer M1 may be formed in the third interlayer insulating layer 130. In detail, the first vias VI1, which are respectively connected to the active and gate contacts AC and GC, may be formed in a lower portion of the third interlayer insulating layer 130. Each of the first vias VI1 may include the barrier metal BM and the filler metal FM. The interconnection lines M1_R1, M1_R2, M1_R3, and MU, which are in contact with the first vias VI1, may be formed in an upper portion of the third interlayer insulating layer 130. The fourth interlayer insulating layer 140 may be formed on the third interlayer insulating layer 130. The second metal layer M2 may be formed in the fourth interlayer insulating layer 140.

Figure 14A:
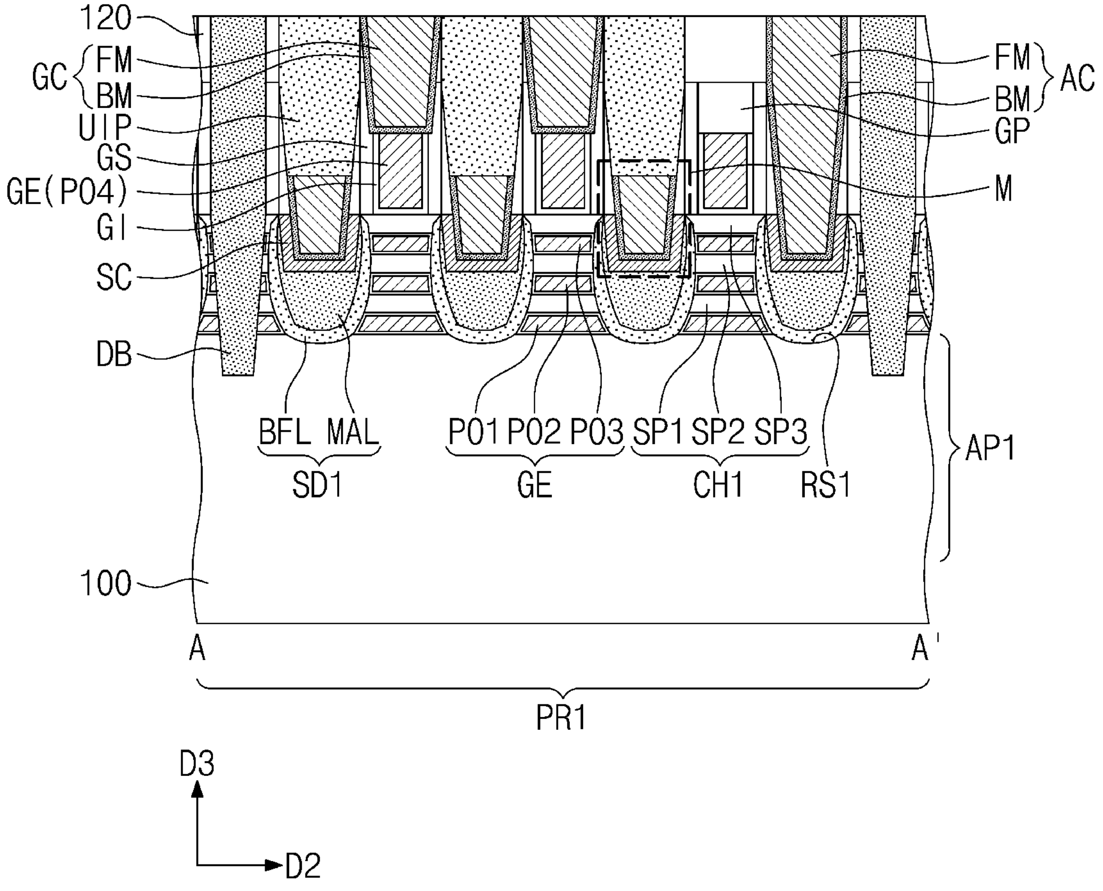
Figure 14B:
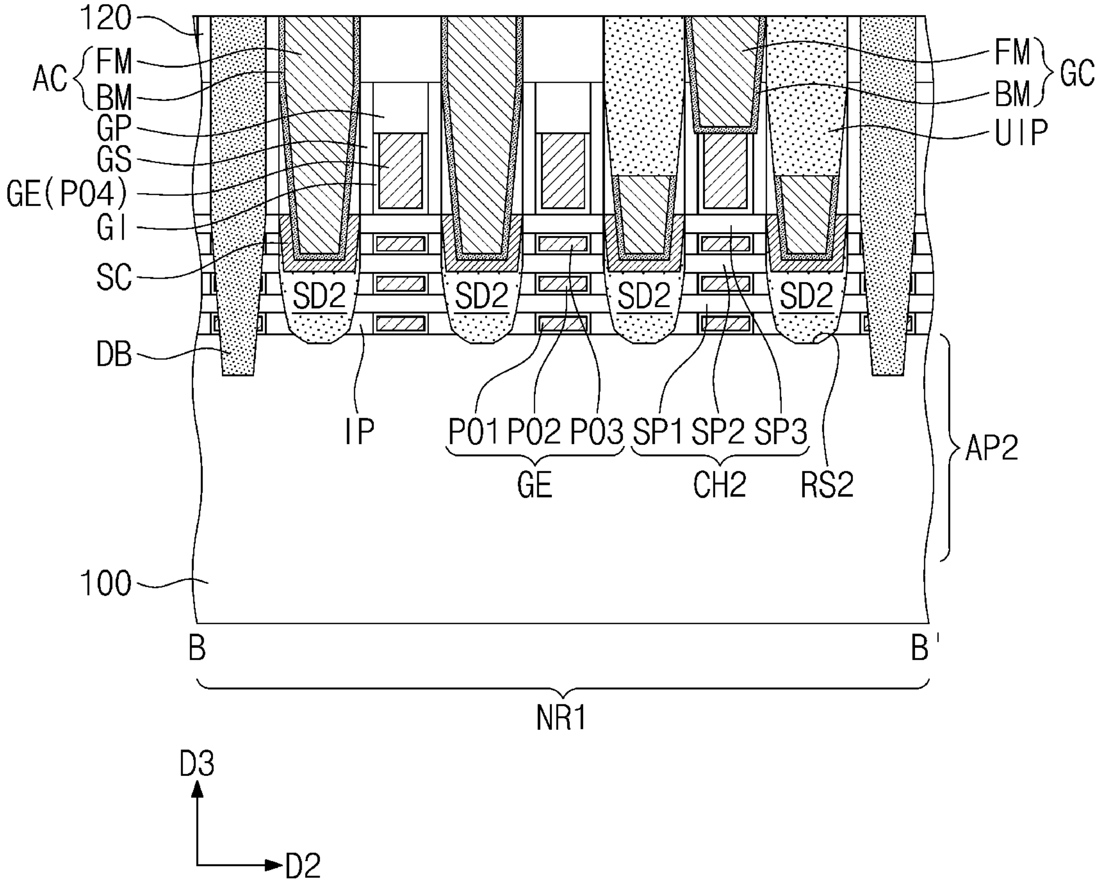
Figure 14C:
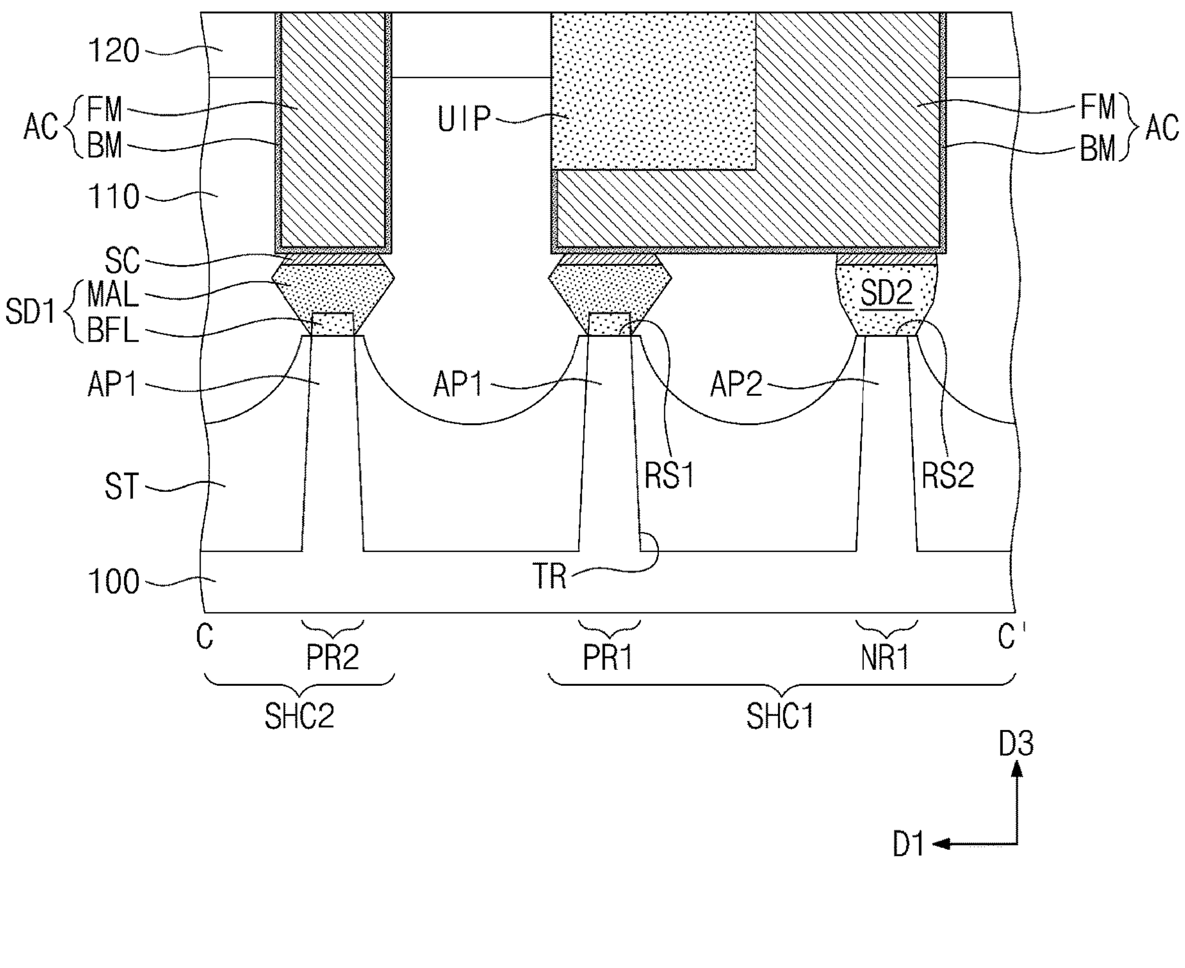
Figure 14D:
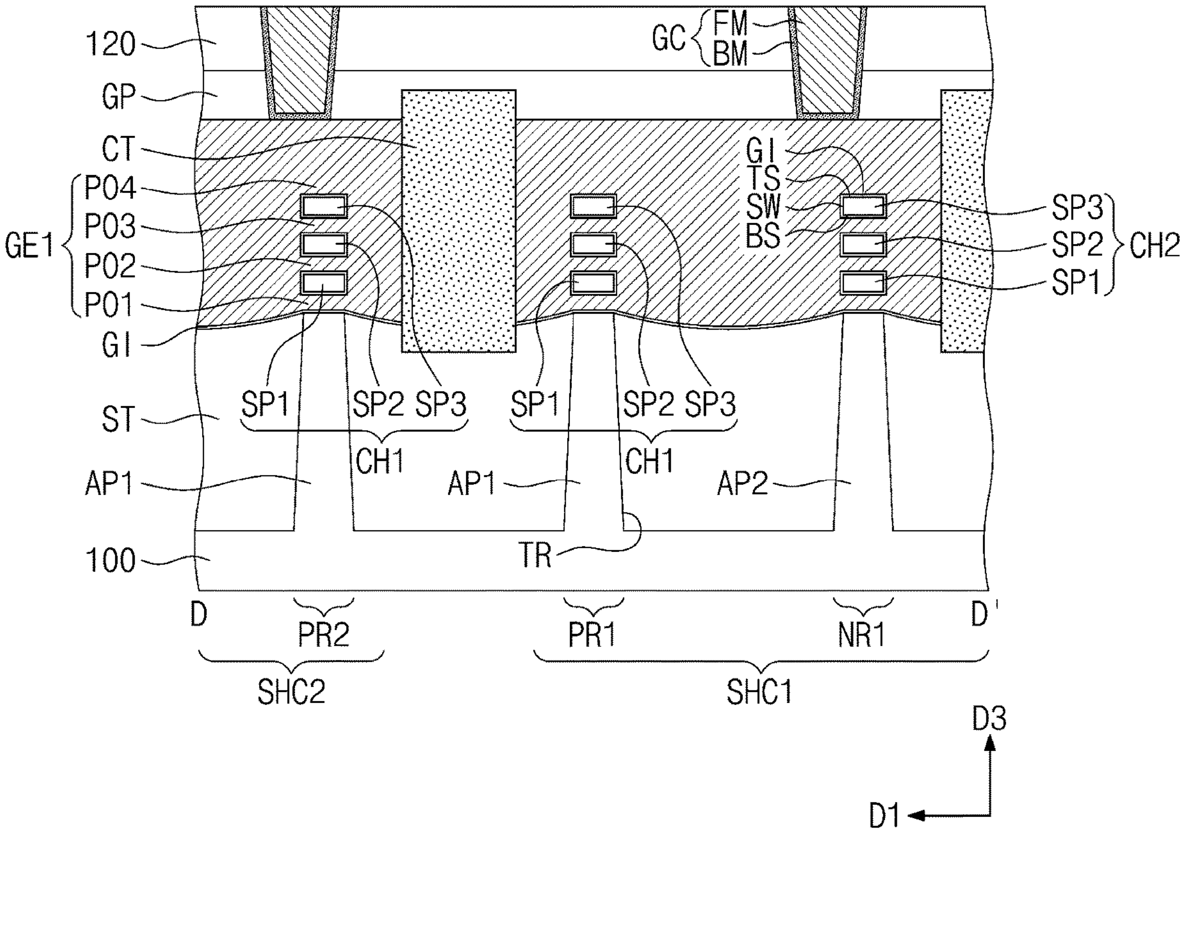
Figure 15:
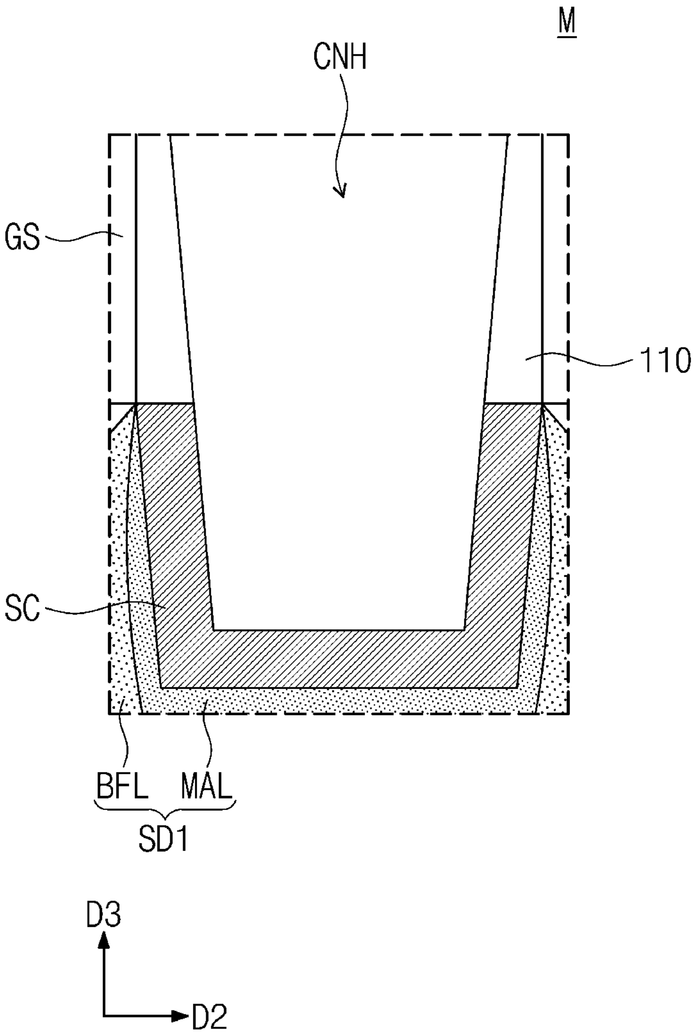
FIGS. 15 to 17 are enlarged sectional views illustrating a method of forming an active contact in a portion 'M' of FIG. 14A.
Figure 16:
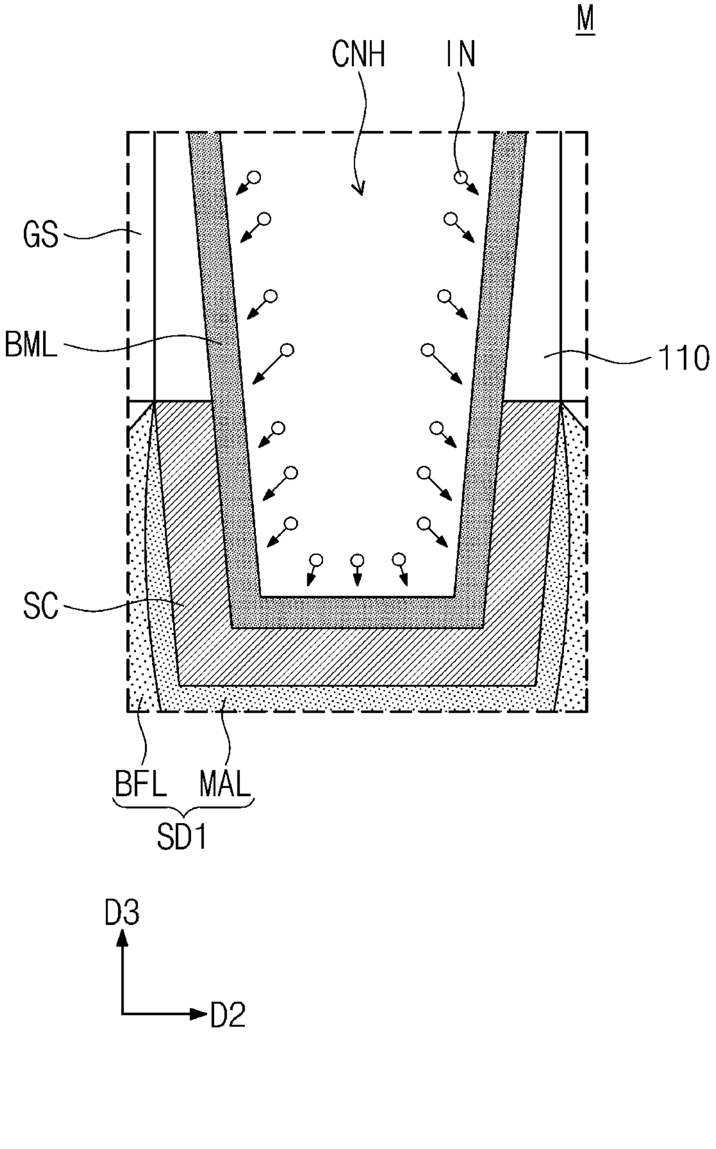
Figure 17:
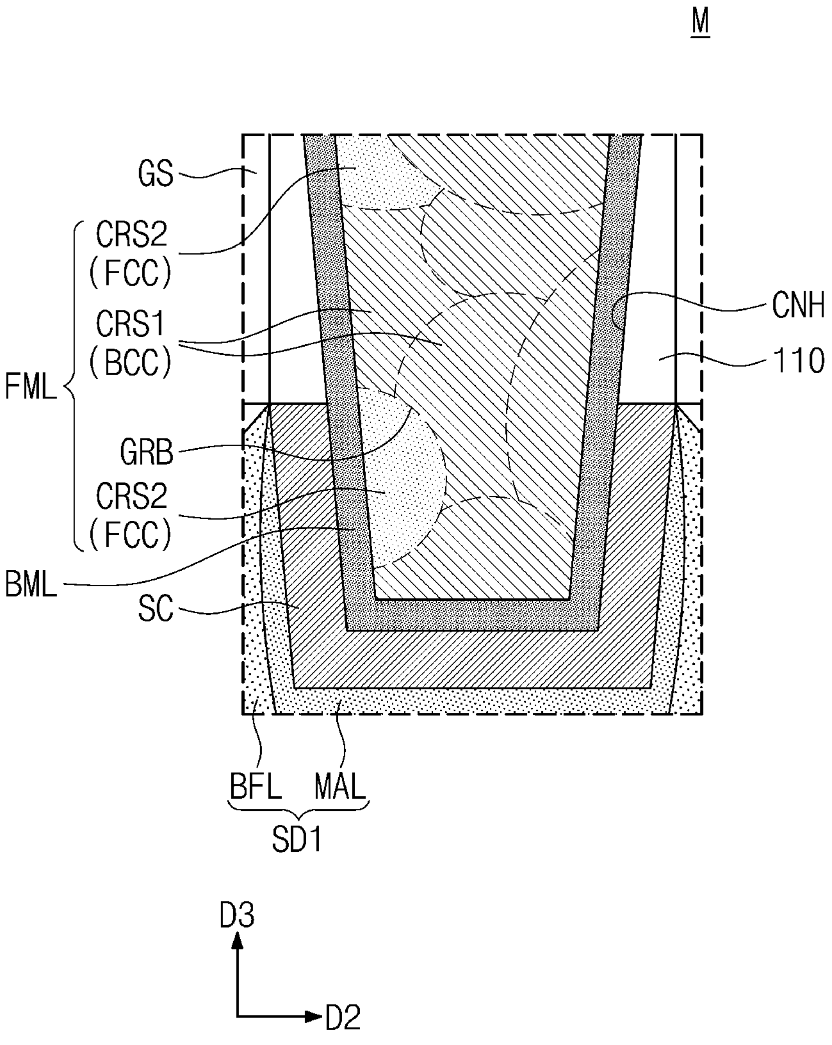

FIGS. 15 to 17 are enlarged sectional views illustrating a method of forming an active contact in a portion 'M' of FIG. 14A. Referring to FIG. 15, the contact trench CNH may be formed to penetrate the first interlayer insulating layer 110. For example, the contact trench CNH may be formed to at least partially expose the first source/drain pattern SD1. A bottom of the contact trench CNH may be lower than a top surface of the first source/drain pattern SD1in the D3 direction as shown in FIG. 15.

The metal-semiconductor compound layer SC may be formed by performing a silicidation process on the first source/drain pattern SD1 exposed through the contact trench CNH. The metal-semiconductor compound layer SC may be formed by reaction between a semiconductor material of the first source/drain pattern SD1, which is exposed through the contact trench CNH, and a metallic material, which is supplied through the contact trench CNH.

Referring to FIG. 16, a barrier metal layer BML may be formed to conformally at least partially cover an inner surface of the contact trench CNH. The barrier metal layer BML may be formed using a chemical vapor deposition (CVD) process. The barrier metal layer BML may include a metal nitride (e.g., TiN) layer.

According to embodiments of the inventive concept, the barrier metal layer BML may be formed using plasma. In an embodiment, the barrier metal layer BML may be formed using a deposition process (e.g., PECVD process), which is performed under plasma environment. In another embodiment, the barrier metal layer BML may be formed using a deposition process, and then, a plasma-using post-treatment process may be further performed on the barrier metal layer BML.

Because the barrier metal layer BML is exposed to plasma, the barrier metal layer BML may experience an ion bombardment caused by ions IN in plasma. The ions IN may be produced by supplying inactive and/or inert gases (e.g., nitrogen, argon, helium, neon, krypton, and xenon gases) in a process chamber during the plasma process.

In an embodiment, the ion IN bombarding of the barrier metal layer BML may include a nitrogen ion. In another embodiment, the ion IN bombarding of the barrier metal layer BML may include an argon ion. In this case, argon (Ar) may be left in the barrier metal layer BML and may serve as an impurity. In other words, the impurity, which is left in the barrier metal layer BML, may include argon, helium, neon, krypton, and/or xenon atoms, which are injected in the form of an ion during the plasma process. A concentration of the impurity in the barrier metal layer BML may range from 1E18 atoms/cm3 to 1E21 atoms/cm3.

Because the barrier metal layer BML experiences the process of the ion bombardment, the barrier metal layer BML may have a high density, compared with a layer that is not exposed to the plasma process. The barrier metal layer BML may have compressive stress.

Referring to FIG. 17, a filler metal layer FML may be formed on the barrier metal layer BML. The filler metal layer FML may be formed using a deposition process (e.g., ALD). The filler metal layer FML may be formed of or include at least one of molybdenum, tungsten, ruthenium, cobalt, or vanadium. In an embodiment, the filler metal layer FML may be formed of or include molybdenum.

The filler metal layer FML may include the first crystalline regions CRS1 having a first crystal structure (e.g., a body-centered cubic (BCC) structure) and the second crystalline regions CRS2 having a second crystal structure (e.g., a face-centered cubic (FCC) structure).

During the deposition process of the filler metal layer FML, at least two different crystal structures may be formed in the filler metal layer FML. During the deposition process of the filler metal layer FML, several crystalline regions, which have their own peculiar crystal structures and meet each other to form a boundary, may be formed in the filler metal layer FML. In other words, the filler metal layer FML may include the grain boundary GRB defined between the crystalline regions.

A proportion of the first crystalline regions CRS1 in the filler metal layer FML may range from 60% to 99%. In an embodiment, the proportion of the first crystalline regions CRS1 in the filler metal layer FML may range from 80% to 99%. For example, the filler metal layer FML may include molybdenum, in which a proportion of the BCC structure is higher than 80%. Because the filler metal layer FML is deposited on the barrier metal layer BML exposed to the ion bombardment process to have an increased density, the first crystalline regions CRS1 may account for 60% (preferably 80%) or higher of the filler metal layer FML.

In the case where a proportion of the first crystalline regions CRS1 of the BCC structure is increased in the filler metal layer FML, resistivity of the filler metal layer FML may be lowered in an inversely proportional manner. That is, the higher the proportion of the first crystalline regions CRS1 in the filler metal layer FML, the lower the resistivity of the filler metal layer FML. Because the filler metal layer FML according to some embodiments includes molybdenum in which the BCC structure proportion is 80% or higher, the filler metal layer FML may have a relatively low resistivity of 16 μΩm to 18 μΩcm.

Referring back to FIG. 14A, the filler metal layer FML and the barrier metal layer BML in the contact trench CNH may be recessed to form the filler metal FM and the barrier metal BM, respectively. The filler metal FM and the barrier metal BM may constitute the active contact AC. The upper insulating pattern UIP may be formed on the active contact AC to fill the recessed region.

Although not shown, the method of forming the barrier metal layer BML and the filler metal layer FML, described with reference to FIGS. 15 to 17, may be used to form each of the gate contact GC and the first via VI1.

According to an embodiment of the inventive concept, because the active contact AC is formed in the relatively wide contact trench CNH, the ion bombardment process may be more easily performed on the barrier metal layer BML. Thus, it may be possible to more effectively increase a density of the barrier metal layer BML of the active contact AC. By contrast, since the gate contact GC and the first via VI1 are formed in relatively narrow holes, the ion bombardment process may be less efficiently performed on the barrier metal layer BML. Thus, a density of the barrier metal layer BML may be lower in each of the gate contact GC and the first via VI1 than in the active contact AC.

Because the barrier metal layer BML of the active contact AC has a relatively high density, a proportion of the body-centered cubic (BCC) structure in the filler metal layer FML formed thereon may be relatively high. By contrast, because the barrier metal layer BML of each of the gate contact GC and the first via VI1 has a relatively low density, a proportion of the body-centered cubic (BCC) structure in the filler metal layer FML formed thereon may be relatively low.

Figure 18:
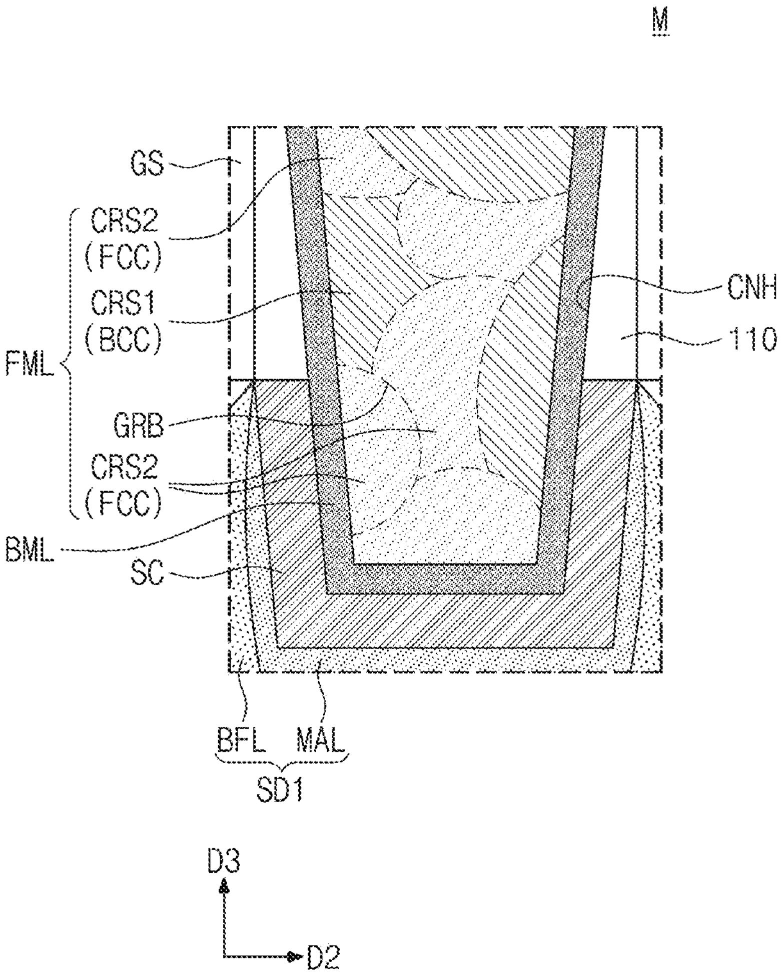
FIG. 18 (Prior Art)
FIG. 18 is an enlarged sectional view illustrating a method of forming an active contact in the portion 'M' of FIG. 14A, according to a comparative example.
Figure 19A:
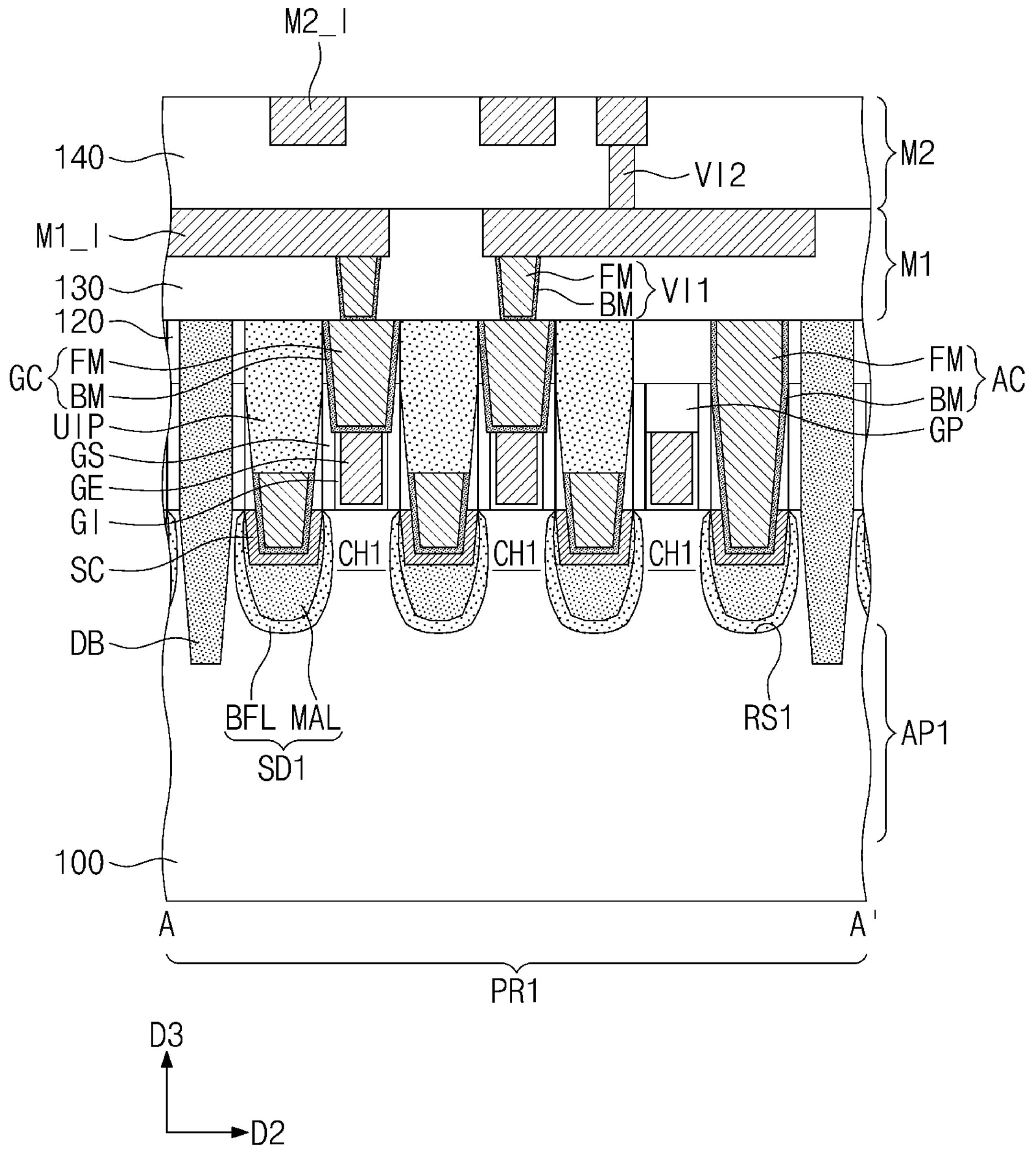
FIGS. 19A to 19D are sectional views, which are respectively taken along lines A-A', B-B', C-C', and D-D' of FIG. 4 to illustrate a semiconductor device according to an embodiment of the inventive concept.
Figure 19B:
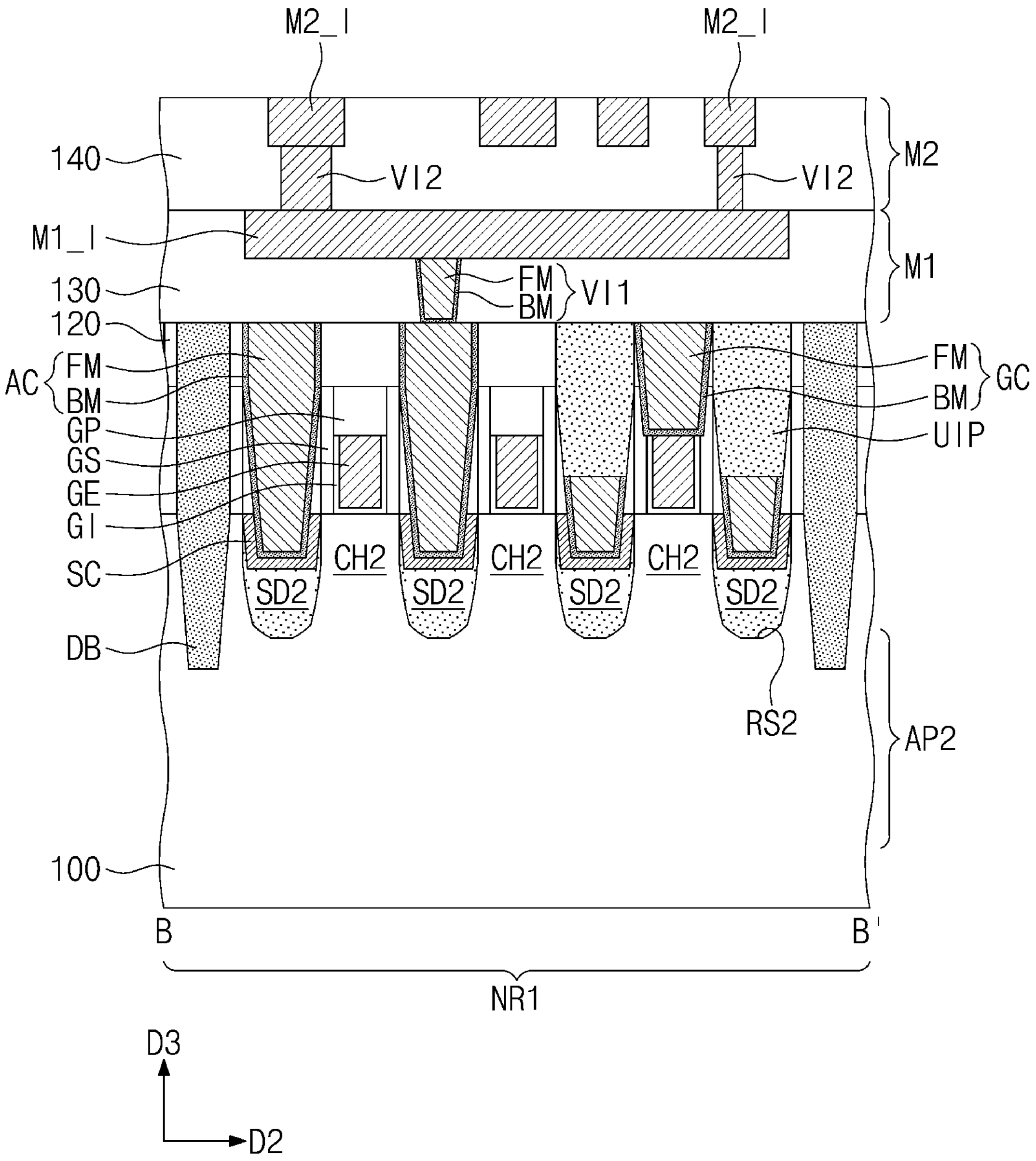
Figure 19C:
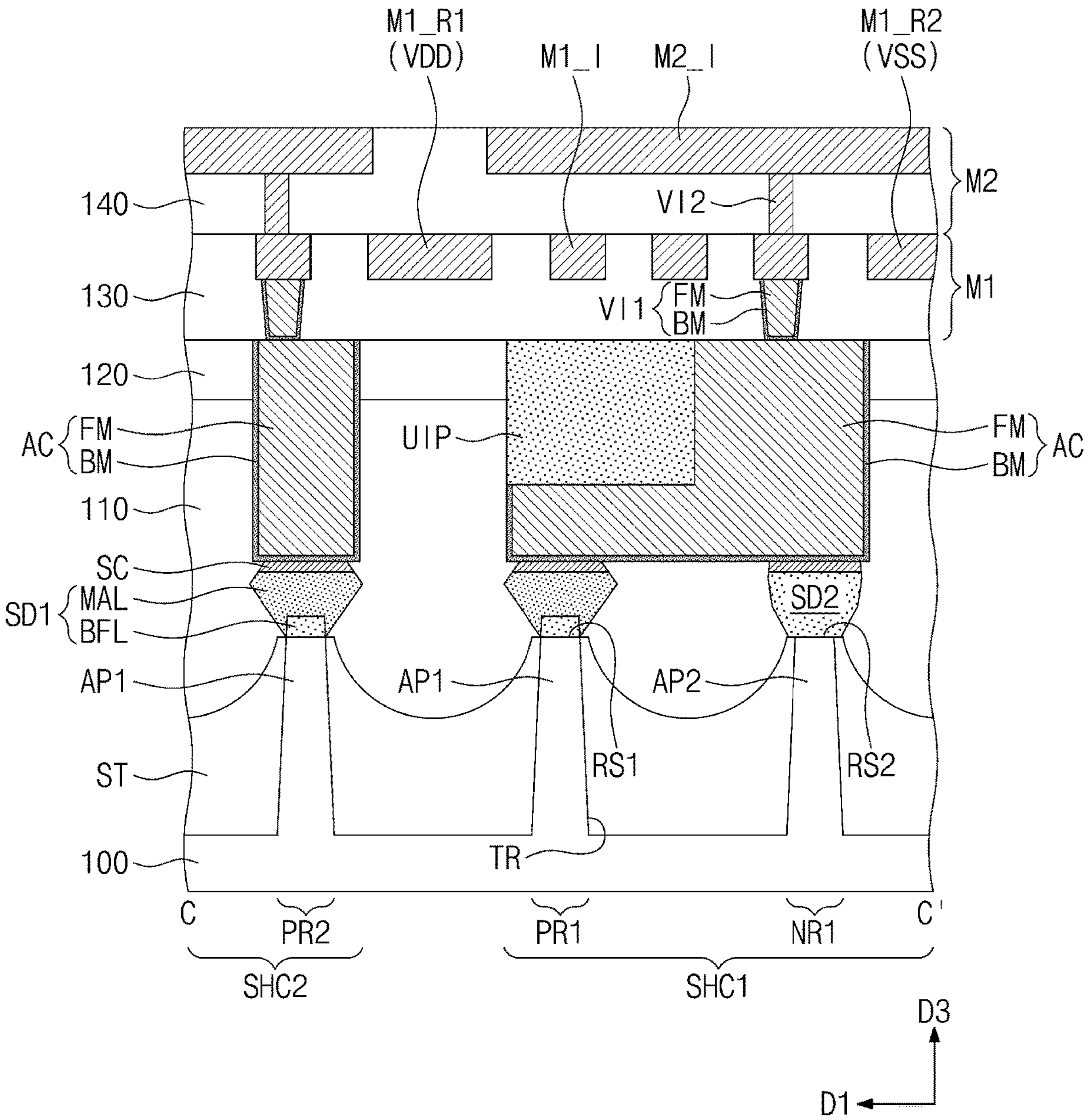
Figure 19D:
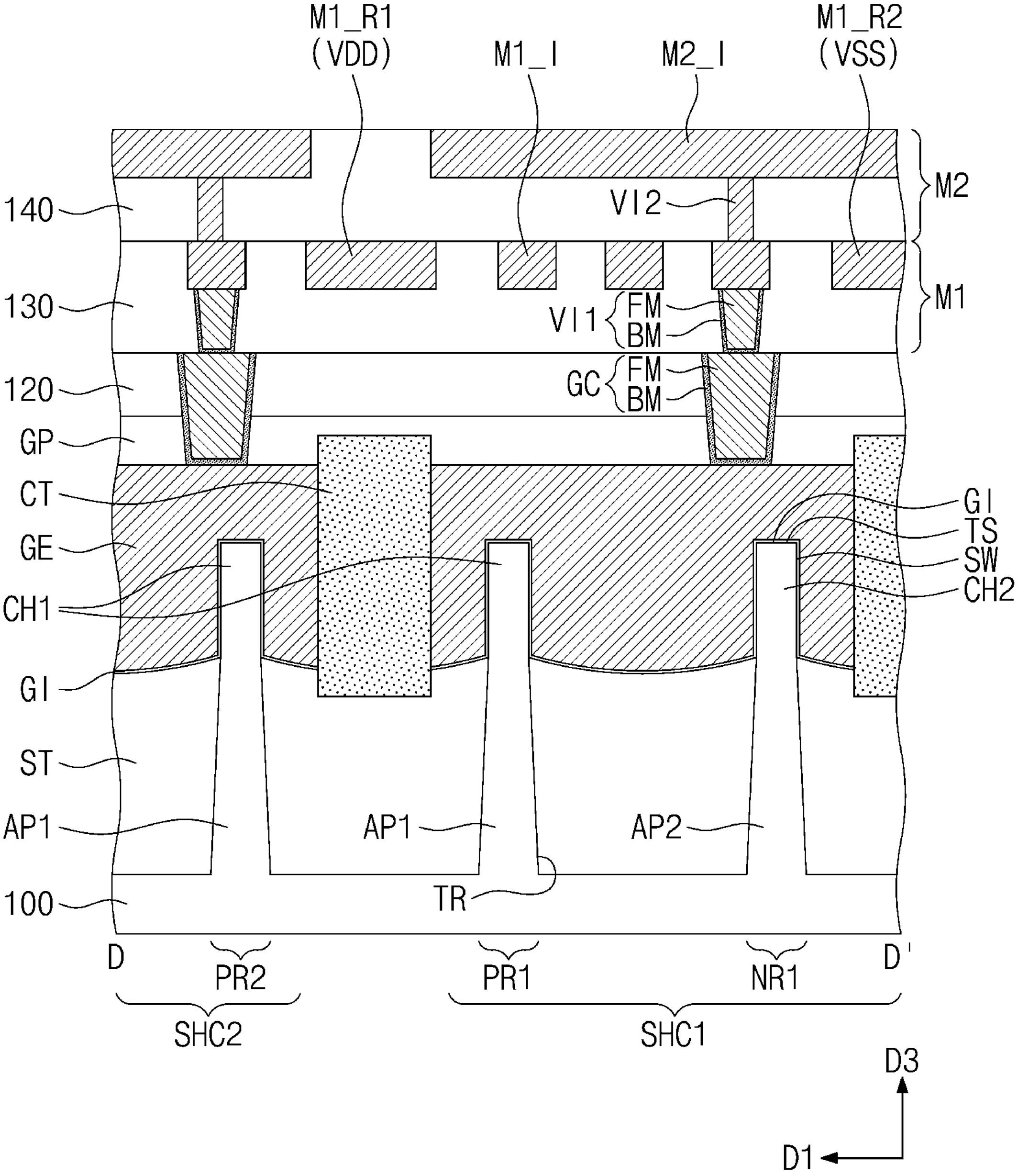

FIG. 18 is an enlarged sectional view illustrating a method of forming an active contact in the portion 'M' of FIG. 14A, according to a comparative example. Referring to FIG. 18, a barrier metal layer BML according to the comparative example may be formed through a process, which does not use plasma or uses less plasma. For example, the barrier metal layer BML according to the comparative example may be formed by only a simple CVD process, and the subsequent post-treatment process using plasma may be omitted. Accordingly, the barrier metal layer BML according to the comparative example may have a density that is lower than that of the barrier metal layer BML, on which the ion bombardment process of FIG. 16 is performed.

For the filler metal layer FML, which is deposited on the barrier metal layer BML according to the comparative example, the first crystalline regions CRS1 may be formed to have a relatively small fraction. For example, a proportion of the first crystalline regions CRS1 in the filler metal layer FML according to the comparative example may be less than 60%. In other words, a proportion of the second crystalline regions CRS2 in the filler metal layer FML may have a relatively increased value.

In the comparative example, because a proportion of a BCC structure in the filler metal layer FML is relatively low, the filler metal layer FML may have relatively high resistivity. For example, the resistivity of the filler metal layer FML according to the comparative example may be greater than 18 μΩcm. This is because the filler metal layer FML has a crystal structure that is determined by a property of an underlying layer (i.e., the barrier metal layer BML), which is located under the same during its deposition process.

FIGS. 19A to 19D are sectional views, which are respectively taken along lines A-A', B-B', C-C', and D-D' of FIG. 4 to illustrate a semiconductor device according to an embodiment of the inventive concept. For concise description, an element previously described with reference to FIGS. 4 and 5A to 5D may be identified by the same reference number without repeating an overlapping description thereof.

Referring to FIGS. 4 and 19A to 19D, the device isolation layer ST may define the first and second active patterns AP1 and AP2 in an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The device isolation layer ST may be on and at least partially cover a lower side surface of each of the first and second active patterns AP1 and AP2. An upper portion of each of the first and second active patterns AP1 and AP2 may be a protruding pattern, which extends vertically, i.e., in the D3 direction or a direction normal to an upper surface of the substrate, above the device isolation layer ST (e.g., see FIG. 19D).

The first active pattern AP1 may include the first source/drain patterns SD1, which are provided in an upper portion thereof, and the first channel pattern CH1, which is provided between the first source/drain patterns SD1. The second active pattern AP2 may include the second source/drain patterns SD2, which are provided in an upper portion thereof, and the second channel pattern CH2, which is provided between the second source/drain patterns SD2.

Referring back to FIG. 19D, each of the first and second channel patterns CH1 and CH2 may not include the stack of the first to third semiconductor patterns SP1, SP2, and SP3 previously described with reference to FIGS. 5A to 5D. Each of the first and second channel patterns CH1 and CH2 may be shaped like a single semiconductor pillar that protrudes above the device isolation layer ST (e.g., see FIG. 19D).

The gate electrode GE may be provided on the top surface TS and the opposite side surfaces SW of each of the first and second channel patterns CH1 and CH2. In other words, the transistor according to the present embodiment may be a three-dimensional field-effect transistor (e.g., FinFET), in which the gate electrode GE is provided to three-dimensionally at least partially surround the channel patterns.

The first interlayer insulating layer 110 and the second interlayer insulating layer 120 may be provided on the substrate 100. The active contacts AC may penetrate the first and second interlayer insulating layers 110 and 120 and may be connected to the first and second source/drain patterns SD1 and SD2, respectively. The gate contact GC may penetrate the second interlayer insulating layer 120 and the gate capping pattern GP and may be connected to the gate electrode GE. The active contacts AC and the gate contacts GC may be configured to have substantially the same features as those described with reference to FIGS. 4, 5A to 5D, and 6.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be configured to have substantially the same features as those described with reference to FIGS. 4 and 5A to 5D.

According to an embodiment of the inventive concept, a filler metal of a contact of a semiconductor device may have a body-centered cubic (BCC) structure in a relatively high proportion. In the case where the proportion of the body-centered cubic (BCC) structure in the filler metal of the contact is increased, the contact may have lower resistivity. As a result, an electrical resistance between transistors constituting a logic circuit and a first metal layer thereon may be reduced, and this may make it possible to improve electrical characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:

a substrate including an active pattern;

a channel pattern and a source/drain pattern that are on the active pattern and connected to each other; and an active contact electrically connected to the source/drain pattern, wherein the active contact comprises a first barrier metal and a first filler metal on the first barrier metal and an upper insulating pattern on the first filler metal and the first barrier metal, wherein the first barrier metal comprises a metal nitride layer, wherein the first filler metal comprises at least one of molybdenum, tungsten, ruthenium, cobalt, or vanadium, wherein the first filler metal comprises a first crystalline region having a body-centered cubic (BCC) structure and a second crystalline region having a face-centered cubic (FCC) structure, wherein the upper insulating pattern is in contact with upper surfaces of the first filler metal and the first barrier metal, wherein an upper surface of the upper insulating pattern is coplanar with an upper surface of a gate contact, wherein a top surface of a first insulating pattern is coplanar with an upper surface of a gate capping pattern, a second insulating pattern on the first insulating pattern cover the gate capping pattern and a top surface of a second insulating pattern is coplanar with the upper surface of the gate contact, and wherein a proportion of the first crystalline region in the first filler metal ranges from 60% to 99%.

2. The semiconductor device of claim 1, wherein, in the first filler metal, the proportion of the first crystalline region is higher than a proportion of the second crystalline region.

3. The semiconductor device of claim 1, wherein the first barrier metal comprises a titanium nitride layer, wherein the first filler metal comprises molybdenum, and wherein the proportion of the first crystalline region in the first filler metal ranges from 80% to 99%.

4. The semiconductor device of claim 1, wherein the first filler metal further comprises a grain boundary between the first crystalline region and the second crystalline region.

5. The semiconductor device of claim 1, wherein the first barrier metal comprises one or more of argon, helium, neon, krypton, or xenon.

6. The semiconductor device of claim 1, wherein the first filler metal has resistivity of 16 μΩcm to 18 μΩcm.

7. The semiconductor device of claim 1, further comprising:

a gate electrode on the channel pattern;

wherein the gate contact is electrically connected to the gate electrode, wherein the gate contact comprises a second barrier metal and a second filler metal on the second barrier metal, wherein the second filler metal comprises a third crystalline region having a body-centered cubic (BCC) structure and a fourth crystalline region having a face-centered cubic (FCC) structure, and wherein the proportion of the first crystalline region in the first filler metal is higher than a proportion of the third crystalline region in the second filler metal.

8. The semiconductor device of claim 1, further comprising:

an interconnection line on the active contact; and a via that electrically connects the interconnection line to the active contact, wherein the via comprises a second barrier metal and a second filler metal on the second barrier metal, wherein the second filler metal comprises a third crystalline region having a body-centered cubic (BCC) structure and a fourth crystalline region having a face-centered cubic (FCC) structure, and wherein the proportion of the first crystalline region in the first filler metal is higher than a proportion of the third crystalline region in the second filler metal.

9. The semiconductor device of claim 1, wherein the first barrier metal is on a surface of the first filler metal while a top surface of the first filler metal remains free of the first barrier metal.

10. The semiconductor device of claim 1, wherein a resistivity of the first filler metal decreases as the proportion of the first crystalline region in the first filler metal increases.

11. A semiconductor device, comprising:

a substrate including an active pattern;

a channel pattern and a source/drain pattern that are on the active pattern and connected to each other;

an active contact coupled to the source/drain pattern; and a metal layer on the active contact, an interconnection line in the metal layer that is electrically connected to the active contact through a via, wherein the active contact comprises a first barrier metal, a first filler metal on the first barrier metal, and an upper insulating pattern on the first filler metal and the first barrier metal, wherein the upper insulating pattern is in contact with upper surfaces of the first filler metal and the first barrier metal, wherein an upper surface of the upper insulating pattern is coplanar with an upper surface of a gate contact, wherein a top surface of a first insulating pattern is coplanar with an upper surface of a gate capping pattern, a second insulating pattern on the first insulating pattern cover the gate capping pattern and a top surface of a second insulating pattern is coplanar with the upper surface of the gate contact, wherein the via comprises a second barrier metal and a second filler metal on the second barrier metal, wherein each of the first and second barrier metals comprises a metal nitride layer, wherein each of the first and second filler metals comprises at least one of molybdenum, tungsten, ruthenium, cobalt, or vanadium, wherein the first filler metal comprises a first crystalline region having a body-centered cubic (BCC) structure and the second filler metal comprises a second crystalline region having the body-centered cubic (BCC) structure; and wherein a proportion of the body-centered cubic (BCC) structure in the first filler metal is higher than a proportion of a body-centered cubic (BCC) structure in the second filler metal.

12. The semiconductor device of claim 11, wherein the proportion of the body-centered cubic (BCC) structure in each of the first and second filler metals ranges from 60% to 99%.

13. The semiconductor device of claim 11, wherein each of the first and second barrier metals comprises a titanium nitride layer, and wherein each of the first and second filler metals comprises molybdenum.

14. The semiconductor device of claim 11, wherein the first filler metal has a resistivity lower than a resistivity of the second filler metal.

15. The semiconductor device of claim 14, wherein the resistivities of the first and second filler metals, respectively, are in a range of 16 μΩcm to 18 μΩcm.

16. A semiconductor device, comprising:

a substrate including a PMOSFET region and an NMOSFET region;

a first active pattern on the PMOSFET region and a second active pattern on the NMOSFET region;

a first channel pattern and a first source/drain pattern on the first active pattern;

a second channel pattern and a second source/drain pattern on the second active pattern; a gate electrode on the first and second channel patterns;

a gate insulating layer between the gate electrode and the first and second channel patterns; a gate spacer on a side surface of the gate electrode;

a gate capping pattern on a top surface of the gate electrode; a gate cutting pattern penetrating the gate electrode;

an interlayer insulating layer on the gate capping pattern and the gate cutting pattern; active contacts that penetrates the interlayer insulating layer and is electrically connected to the first and second source/drain patterns;

metal-semiconductor compound layers between the active contact contacts and the first and second source/drain patterns, respectively;

a gate contact that penetrates the interlayer insulating layer and the gate capping pattern and is electrically connected to the gate electrode;

a first metal layer on the interlayer insulating layer, the first metal layer comprising a power line, which overlaps the gate cutting pattern in a direction normal to a surface of the substrate, and first interconnection lines, which are electrically connected to the active and gate contacts, respectively; and a second metal layer on the first metal layer, wherein the first source/drain pattern comprises a buffer layer on the substrate and a main layer on the buffer layer, wherein the second metal layer comprises second interconnection lines electrically connected to the first metal layer, wherein a first active contact of the active contacts comprises a first barrier metal, a first filler metal on the first barrier metal, and an upper insulating pattern on the first filler metal and the first barrier metal, wherein the upper insulating pattern is in contact with upper surfaces of the first filler metal and the first barrier metal, wherein an upper surface of the upper insulating pattern is coplanar with an upper surface of the gate contact, wherein a top surface of a first insulating pattern is coplanar with an upper surface of a gate capping pattern, a second insulating pattern on the first insulating pattern cover the gate capping pattern and a top surface of a second insulating pattern is coplanar with the upper surface of the gate contact, wherein the gate contact comprises a second barrier metal and a second filler metal on the second barrier metal, and a proportion of a body-centered cubic (BCC) structure in the first filler metal is higher than a proportion of a body-centered cubic (BCC) structure in the second filler metal.

17. The semiconductor device of claim 16, wherein each of the first and second barrier metals comprises a titanium nitride layer, and wherein each of the first and second filler metals comprises molybdenum.

18. The semiconductor device of claim 16, wherein the proportion of the body-centered cubic (BCC) structure in each of the first and second filler metals ranges from 60% to 99%.

19. The semiconductor device of claim 16, wherein the first filler metal has a resistivity lower than a resistivity of the second filler metal.

20. The semiconductor device of claim 19, wherein the resistivities of the first and second filler metals, respectively, are in a range of 16 μΩcm to 18 μΩcm.

* * * * *